(12) United States Patent
Nakano et al.

(10) Patent No.: US 9,633,720 B2
(45) Date of Patent: Apr. 25, 2017

(54) SEMICONDUCTOR MEMORY DEVICE

(71) Applicant: KABUSHIKI KAISHA TOSHIBA, Minato-ku (JP)

(72) Inventors: Tomoaki Nakano, Yokohama (JP); Shigefumi Irieda, Yokohama (JP); Masashi Yoshida, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/976,534

(22) Filed: Dec. 21, 2015

(65) Prior Publication Data

US 2017/0076788 A1    Mar. 16, 2017

Related U.S. Application Data

(60) Provisional application No. 62/216,800, filed on Sep. 10, 2015.

(51) Int. Cl.
| | | |
|---|---|---|
| *G11C 16/10* | (2006.01) | |
| *G11C 16/04* | (2006.01) | |
| *G11C 16/12* | (2006.01) | |
| *G11C 11/56* | (2006.01) | |
| *G11C 16/34* | (2006.01) | |

(52) U.S. Cl.
CPC .......... *G11C 11/5628* (2013.01); *G11C 16/10* (2013.01); *G11C 16/04* (2013.01); *G11C 16/0483* (2013.01); *G11C 16/12* (2013.01); *G11C 16/3427* (2013.01)

(58) Field of Classification Search
CPC . G11C 16/10; G11C 16/0483; G11C 16/3427; G11C 16/04; G11C 16/12

USPC .......... 365/185.18, 185.23, 185.28
See application file for complete search history.

(56) References Cited

U.S. PATENT DOCUMENTS

| | | | |
|---|---|---|---|
| 2004/0105308 A1* | 6/2004 | Matsunaga | G11C 16/0483 365/185.11 |
| 2009/0213652 A1 | 8/2009 | Park et al. | |
| 2009/0285026 A1* | 11/2009 | Kang | G11C 16/08 365/185.13 |
| 2010/0259980 A1 | 10/2010 | Futatsuyama | |
| 2012/0069679 A1* | 3/2012 | Fujiki | G11C 16/26 365/185.23 |

(Continued)

FOREIGN PATENT DOCUMENTS

| | | |
|---|---|---|
| JP | 2009-205793 | 9/2009 |
| JP | 2010-250891 | 11/2010 |
| JP | 2012-142040 | 7/2012 |

*Primary Examiner* — Ly D Pham
(74) *Attorney, Agent, or Firm* — Oblon, McClelland, Maier & Neustadt, L.L.P.

(57) ABSTRACT

According to one embodiment, a semiconductor memory device includes a first memory cell, a second memory cell, and a third memory cell, a first word line coupled to the first memory cell, the second memory cell, and the third memory cell, a first bit line coupled to the first memory cell, a second bit line coupled to the second memory cell, and a third bit line coupled to the third memory cell. A first voltage, a second voltage, and a third voltage are sequentially applied to the first word line, and a fourth voltage is applied to the first bit line when the first voltage is applied to the first word line, applied to the second bit line when the second voltage is applied to the first word line, and applied to the third bit line when the third voltage is applied to the first word line.

13 Claims, 18 Drawing Sheets

(56) References Cited

U.S. PATENT DOCUMENTS

| | | | |
|---|---|---|---|
| 2012/0170364 A1* | 7/2012 | Jang | G11C 11/5628 365/185.03 |
| 2012/0287720 A1* | 11/2012 | Choi | G11C 16/10 365/185.19 |
| 2013/0094294 A1* | 4/2013 | Kwak | H01L 27/1157 365/185.03 |
| 2013/0128662 A1* | 5/2013 | Song | G11C 16/04 365/185.03 |

* cited by examiner

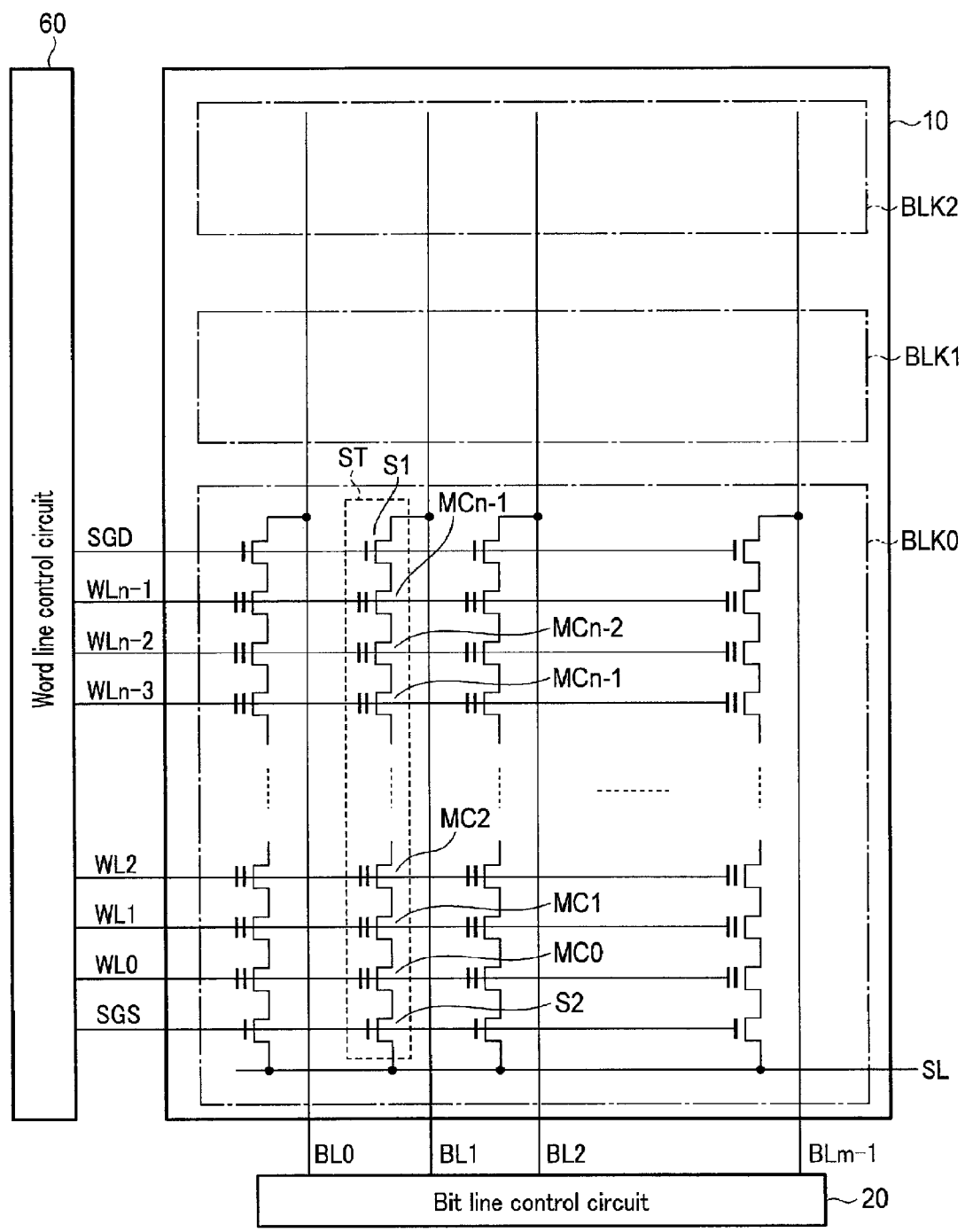
F I G. 2

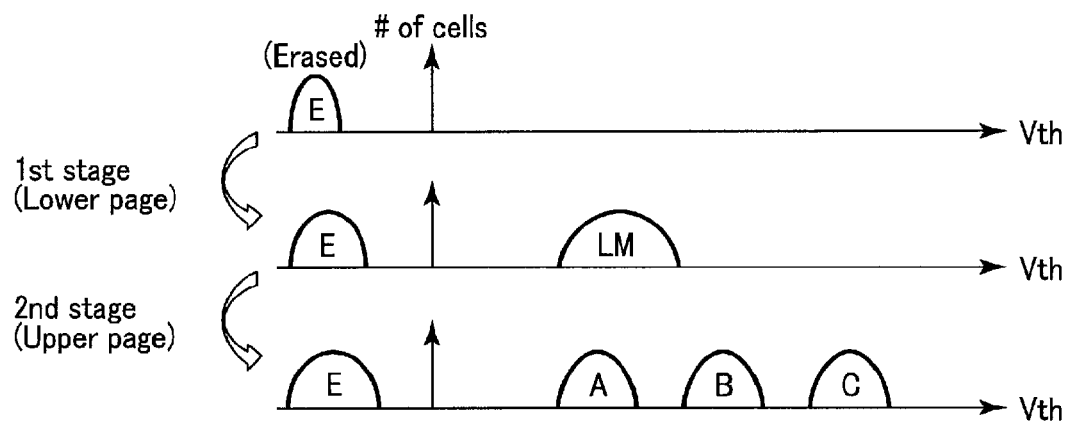
F I G. 3A
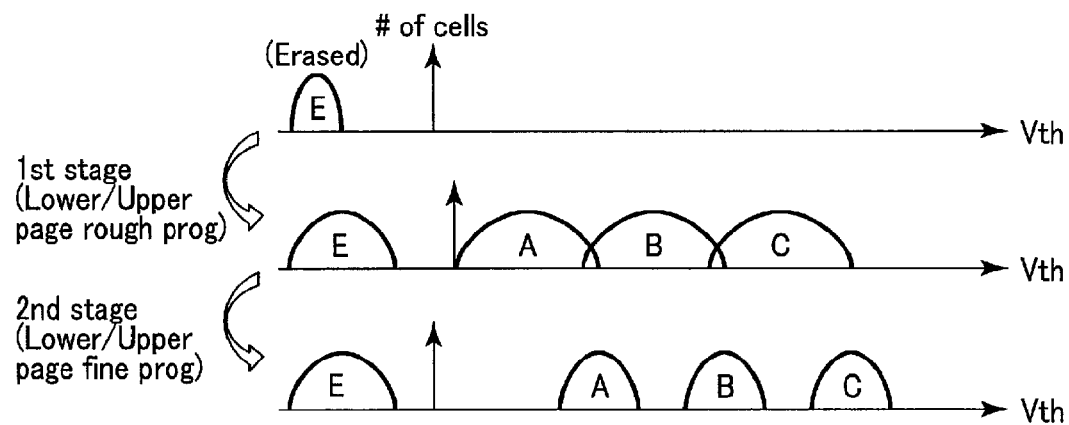
F I G. 3B

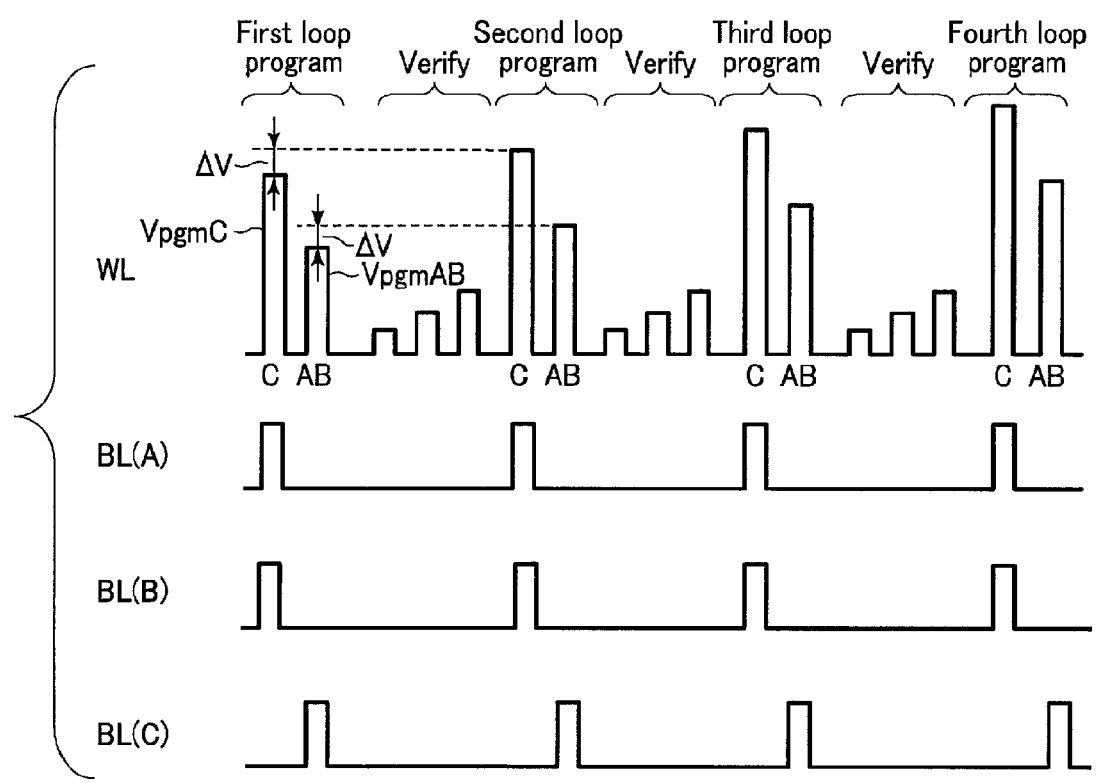
F I G. 6

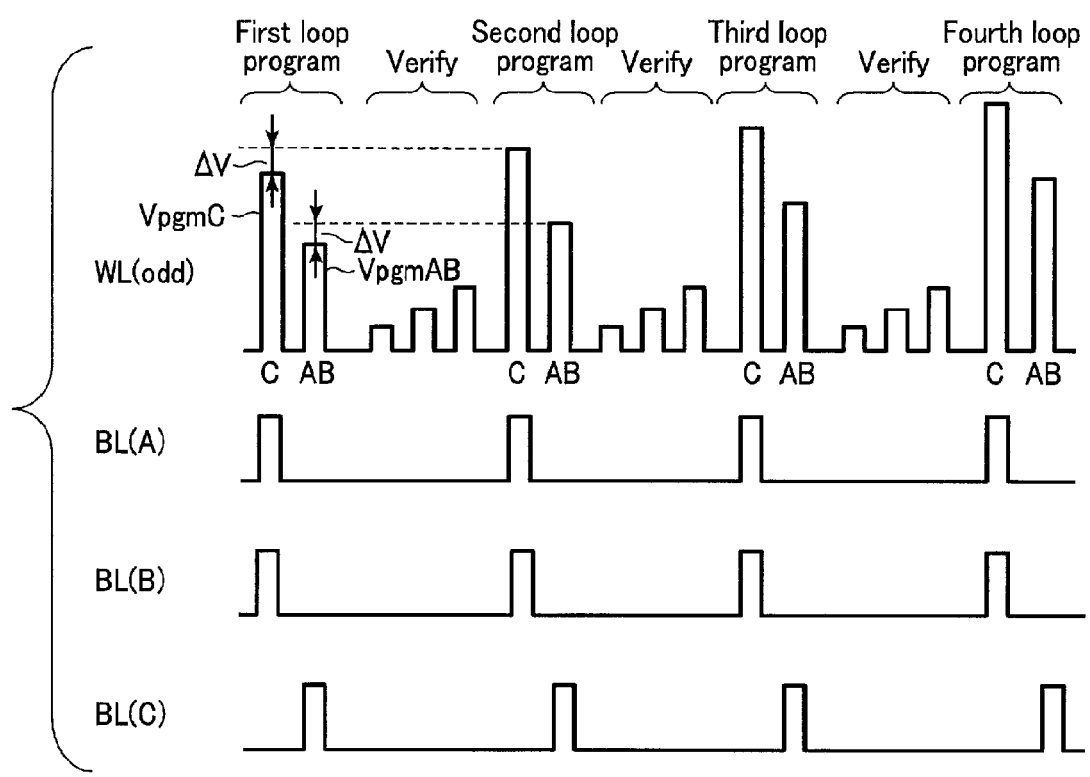
F I G. 8A

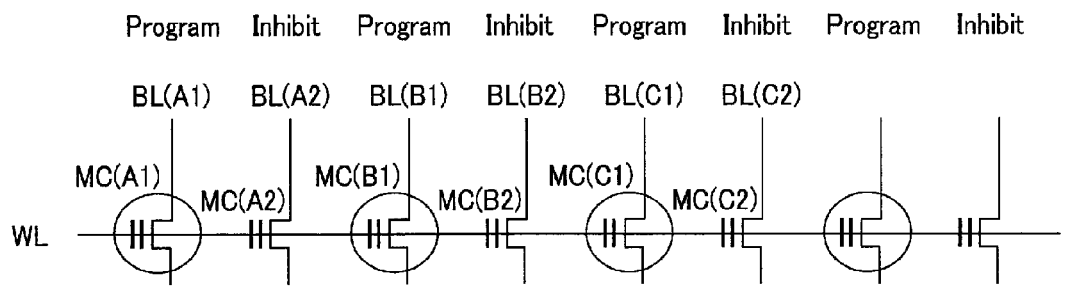
F I G. 12A
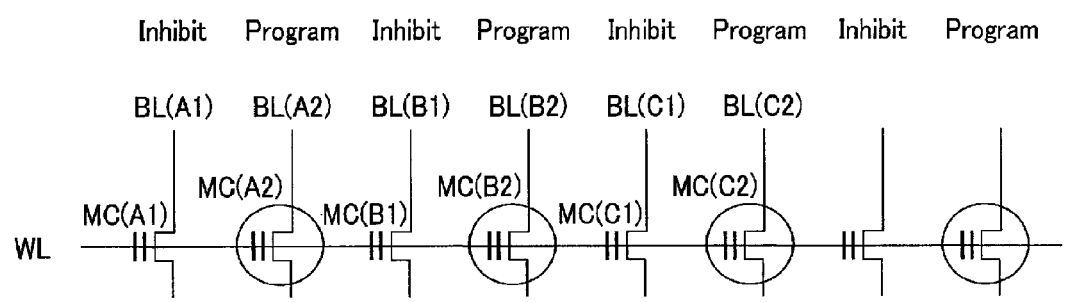
F I G. 12B

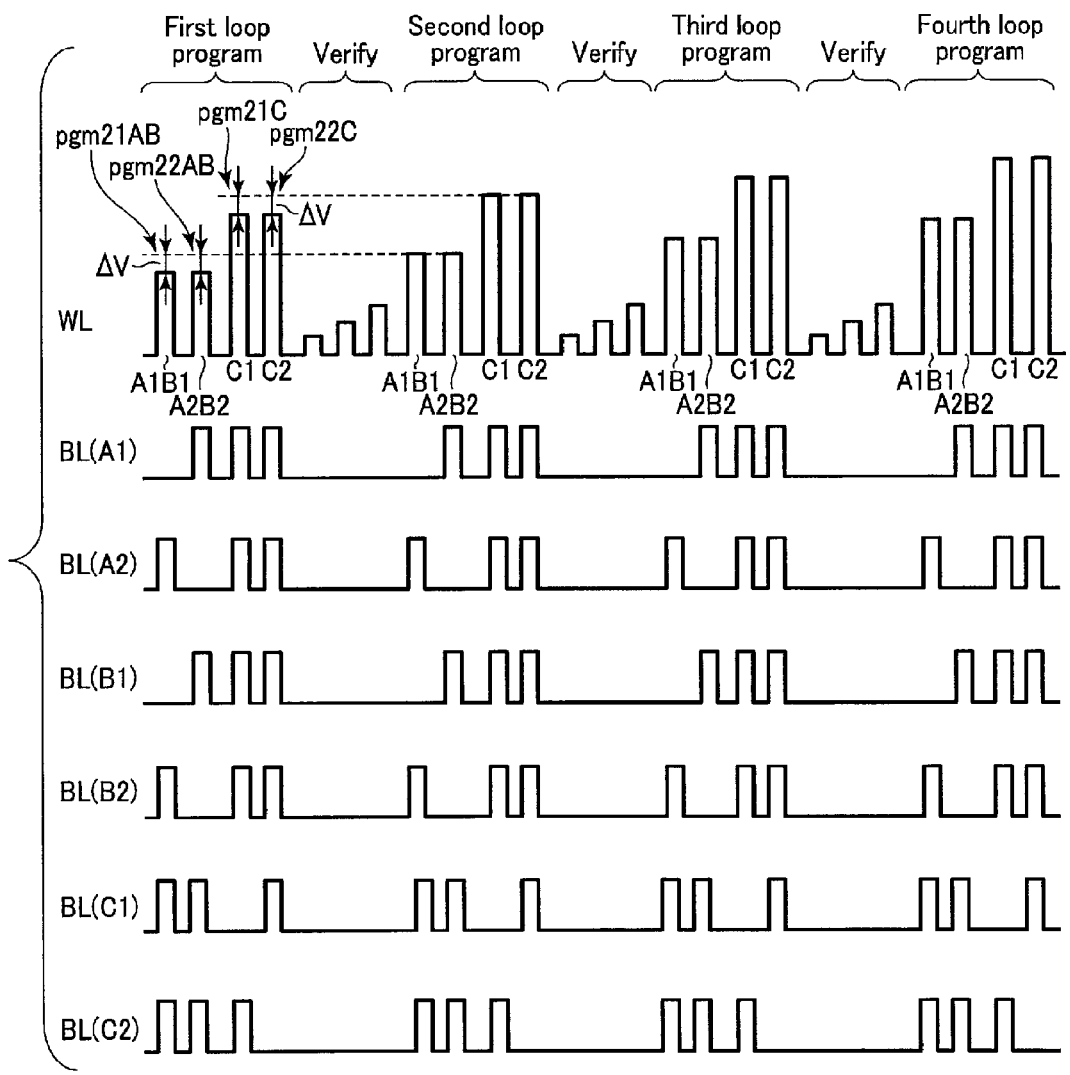
F I G. 13

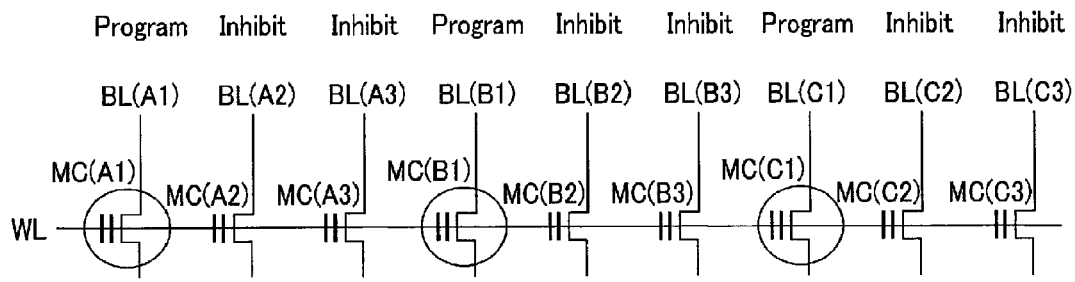
F I G. 14A
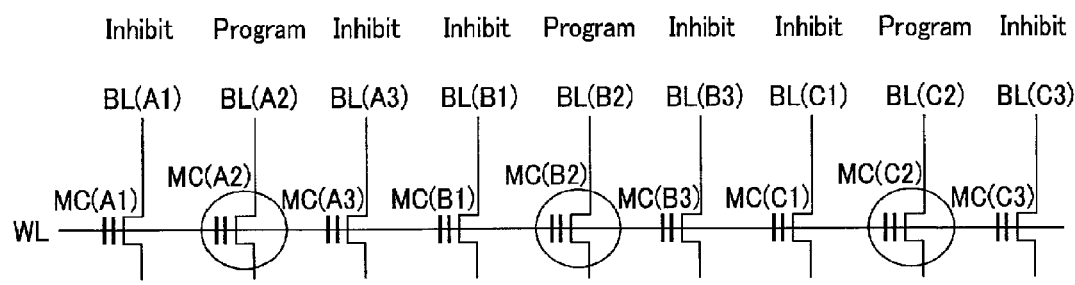
F I G. 14B
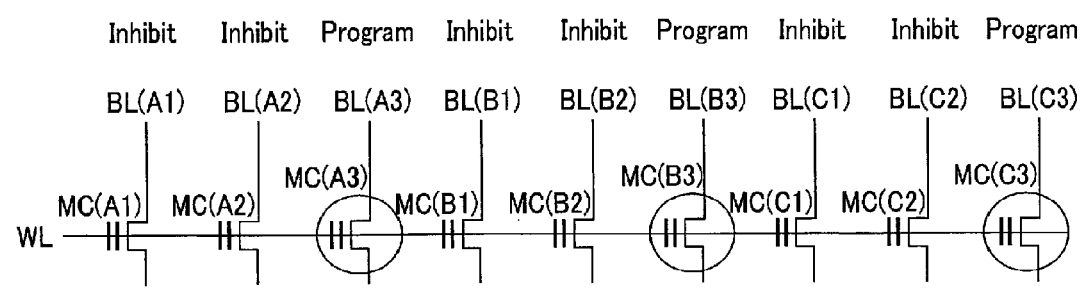
F I G. 14C

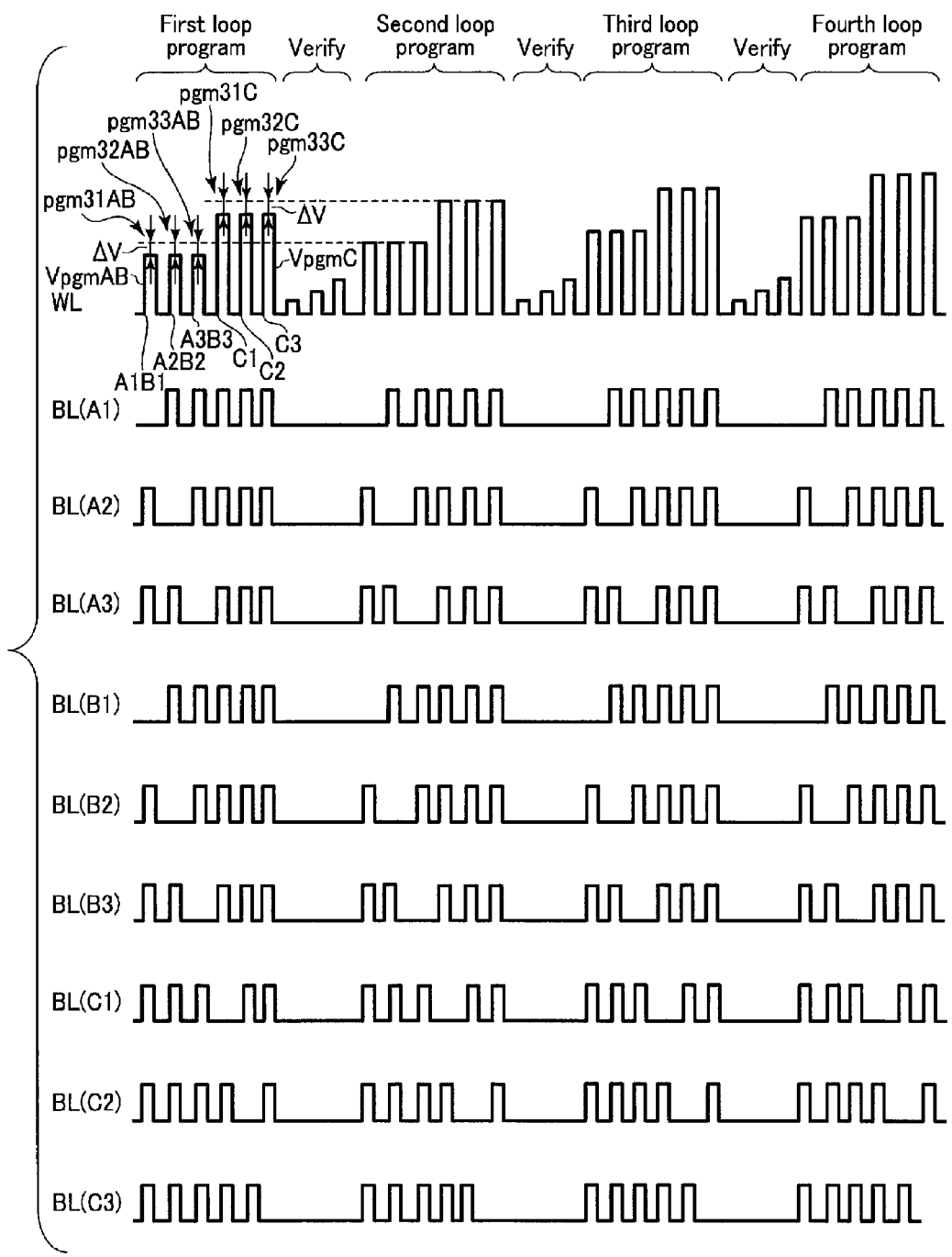
F I G. 15

SEMICONDUCTOR MEMORY DEVICE

FIELD

Embodiments described herein relate generally to a semiconductor memory device.

CROSS REFERENCE TO RELATED APPLICATIONS

This application is based upon and claims the benefit of priority from U.S. Provisional Application No. 62/216,800, filed Sep. 10, 2015, the entire contents of all of which are incorporated herein by reference.

BACKGROUND

There is known a NAND flash memory as a nonvolatile semiconductor memory device which is electrically rewritable and whose degree of integration can be increased. In the NAND flash memory, the memory capacity is increased by applying a multilevel technique to memory cells MC. There have been proposed various methods as multilevel write methods.

BRIEF DESCRIPTION OF THE DRAWINGS

FIG. 2 is a circuit diagram showing the memory cell array of the semiconductor memory device according to the first embodiment;

FIG. 3A is a view showing an example of a threshold distribution in the multilevel write operation of the semiconductor memory device according to the first embodiment;

FIG. 3B is a view showing another example of the threshold distribution in the multilevel write operation of the semiconductor memory device according to the first embodiment;

FIG. 6 is a waveform chart showing various voltages in the multilevel write operation of a semiconductor memory device according to the second embodiment;

FIG. 8A is a waveform chart showing various voltages in the multilevel write operation for an odd-numbered word line of a semiconductor memory device according to the fourth embodiment;

FIG. 12A is a view for explaining the multilevel write operation of a semiconductor memory device according to the seventh embodiment;

FIG. 12B is a view for explaining the multilevel write operation of the semiconductor memory device according to the seventh embodiment;

FIG. 13 is a waveform chart showing various voltages in the multilevel write operation of the semiconductor memory device according to the seventh embodiment;

FIG. 14A is a view for explaining the multilevel write operation of a semiconductor memory device according to the eighth embodiment;

FIG. 14B is a view for explaining the multilevel write operation of the semiconductor memory device according to the eighth embodiment;

FIG. 14C is a view for explaining the multilevel write operation of the semiconductor memory device according to the eighth embodiment;

FIG. 15 is a waveform chart showing various voltages in the multilevel write operation of the semiconductor memory device according to the eighth embodiment;

DETAILED DESCRIPTION

Figure 1:
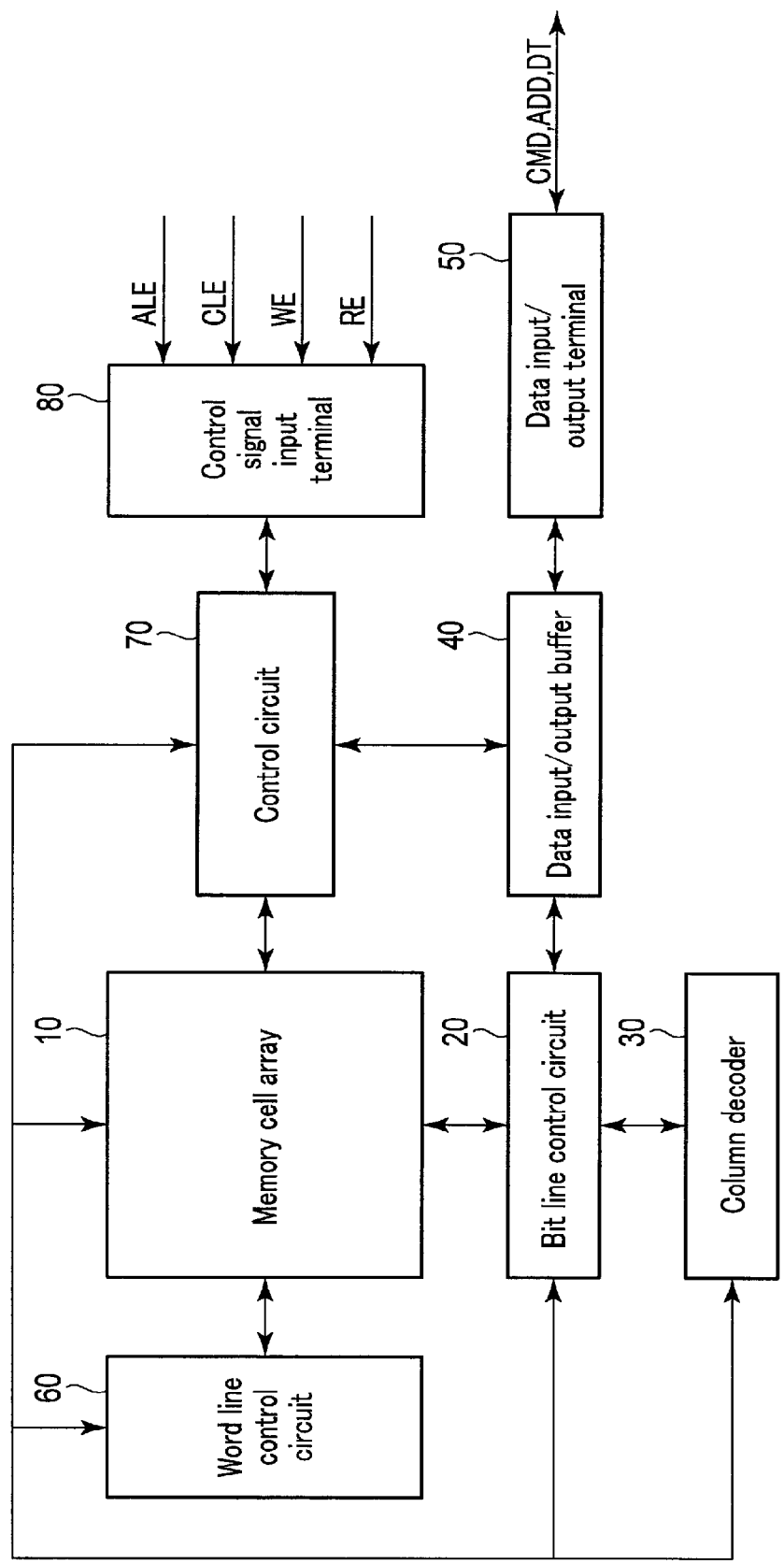
FIG. 1 is a block diagram showing a semiconductor memory device according to the first embodiment.

In general, according to one embodiment, a semiconductor memory device comprises a first memory cell, a second memory cell, and a third memory cell, a first word line coupled to the first memory cell, the second memory cell, and the third memory cell, a first bit line coupled to the first memory cell, a second bit line coupled to the second memory cell, and a third bit line coupled to the third memory cell. A first voltage, a second voltage, and a third voltage are sequentially applied to the first word line in a write operation, and a fourth voltage is applied to the first bit line when the first voltage is applied to the first word line, applied to the second bit line when the second voltage is applied to the first word line, and applied to the third bit line when the third voltage is applied to the first word line.

Embodiments will be described below with reference to the accompanying drawings. The same reference numerals denote the same parts throughout the drawings.

First Embodiment

A semiconductor memory device according to the first embodiment will be described below with reference to FIGS. 1, 2, 3A, 3B, 4, and 5.

In the first embodiment, in a write operation, two kinds of program voltages VpgmAB and VpgmC are sequentially applied to a word line WL, and then the stepped up program voltages VpgmAB and VpgmC are applied to the word line WL. This can decrease the difference in write completion timing between an A-level memory cell MC and a C-level memory cell MC. Therefore, it is possible to suppress the spread of the threshold voltage of the A-level memory cell MC, thereby improving the reliability of the memory.

The first embodiment will be described in detail below.

[Example of Arrangement of First Embodiment]

FIG. 1 is a block diagram showing the semiconductor memory device according to the first embodiment. An example in which the semiconductor memory device is a NAND flash memory will be explained. In the following description, "couple" includes not only direct connection but also connection via an arbitrary element. Furthermore, the first terminal of a transistor indicates one of a source and drain, the second terminal of the transistor indicates the other of the source and drain, and the control terminal of the transistor indicates a gate.

As shown in FIG. 1, the semiconductor memory device includes a memory cell array 10, a bit line control circuit 20, a column decoder 30, a data input/output buffer 40, a data input/output terminal 50, a word line control circuit 60, a control circuit 70, and a control signal input terminal 80.

The memory cell array 10 includes a plurality of bit lines, a plurality of word lines, and a common source line. In addition, the memory cell array 10 includes a plurality of memory cells MC arranged in a matrix. The bit line control circuit 20 and the word line control circuit 60 are coupled to the memory cell array 10.

The bit line control circuit 20 reads data from the memory cells of the memory cell array 10 via the bit lines, detects the states of the memory cells of the memory cell array 10 via the bit lines, and writes data to the memory cells of the memory cell array 10 via the bit lines. The bit line control circuit 20 includes a data storage circuit (not shown), and the data storage circuit temporarily stores write data and read data. The column decoder 30 and the data input/output buffer 40 are coupled to the bit line control circuit 20.

The data storage circuit of the bit line control circuit 20 is selected by the column decoder 30. Data of the memory cell read to the data storage circuit is externally output from the data input/output terminal 50 via the data input/output buffer 40. The data input/output terminal 50 is coupled to a host (not shown) outside a memory chip. This host is formed by, for example, a computer, and receives the data output from the data input/output terminal 50. The host outputs various commands CMD, addresses ADD, and data DT for controlling the operation of the NAND flash memory. Write data input from the host to the data input/output terminal 50 is supplied, via the data input/output buffer 40, to the data storage circuit selected by the column decoder 30, and a command and address are supplied to the control circuit 70.

The word line control circuit 60 is coupled to the memory cell array 10. The word line control circuit 60 selects a word line within the memory cell array 10, and applies a voltage necessary for a read operation, write operation, or erase operation to the selected word line.

The control circuit 70 is coupled to the memory cell array 10, bit line control circuit 20, column decoder 30, data input/output buffer 40, and word line control circuit 60, and controls them. The control circuit 70 is coupled to the control signal input terminal 80, and receives control signals from the host via the control signal input terminal 80. The control signals include an address latch enable signal ALE, a command latch enable signal CLE, a write enable signal WE, and a read enable signal RE. This control circuit 70 generates voltages to the word lines and the bit lines and also generates a voltage to be supplied to a well at the time of data write. The control circuit 70 includes a boost circuit such as a charge pump circuit, and can generate program voltages and other high voltages.

FIG. 2 is a circuit diagram showing the memory cell array 10 of the semiconductor memory device according to the first embodiment.

As shown in FIG. 2, the memory cell array 10 includes a plurality of blocks BLK0 to BLK2. Although the three blocks BLK0 to BLK2 are shown, the present invention is not limited to this.

The block BLK0 includes a plurality of NAND strings ST. Each NAND string ST includes, for example, n (n is an integer of 2 or more) memory cell transistors MC (MC0 to MCn−1) and selection transistors S1 and S2.

Each memory cell transistor MC (to be also simply referred to as the memory cell MC hereinafter) has a stacked gate including a control gate and a charge storage layer, and holds data in a nonvolatile manner. The memory cell transistors MC0 to MCn−1 have a current path formed in series. The first terminal of the memory cell transistor MCn−1 at one end is coupled to the first terminal of the selection transistor S1, and the first terminal of the memory cell transistor MC0 at the other end is coupled to the first terminal of the selection transistor S2.

The gates of the plurality of selection transistors S1 are commonly coupled to a select gate line SGD. On the other hand, the gates of the plurality of selection transistor S2 are commonly coupled to a select gate line SGS. The control terminals of the memory cell transistors MC0 to MCn−1 are commonly coupled to word lines WL0 to WLn−1, respectively.

The second terminals of the selection transistors S1 of the NAND strings ST on the same column (the NAND strings ST arrayed across the blocks BLK) among the NAND strings ST arranged in matrix within the memory cell array 10 are commonly coupled to one of bit lines BL (BL0 to BLm−1 where m is an integer of 2 or more). The second terminals of the selection transistors S2 are commonly coupled to a source line SL. The source line SL is common to, for example, the plurality of blocks BLK.

Data of the memory cell transistors MC in the same block BLK are, for example, collectively erased. To the contrary, data are collectively read or written from or to the plurality of memory cell transistors MC commonly coupled to one of the word lines WL of one of the blocks BLK. This data unit is called "page".

Each of the blocks BLK1 and BLK2 has the same structure as that of the block BLK0 and a description thereof will be omitted.

[Multilevel Write Operation in First Embodiment]

FIG. 3A is a view showing an example of a threshold distribution in the multilevel write operation of the semiconductor memory device according to the first embodiment. FIG. 3B is a view showing another example of the threshold distribution in the multilevel write operation of the semiconductor memory device according to the first embodiment. A 4-level (2-bit) write operation will be exemplified as a multilevel write operation.

Note that in the following description, a "page" has two different meanings. First, a "page" indicates a data unit along one word line, as described above. Second, a "page" indicates a write layer, that is, a programming stage when performing a multilevel write operation to one memory cell MC, and pages include an L (Lower) page, M (Middle) page, and U (Upper) page.

As shown in FIGS. 3A and 3B, the thresholds of all the memory cells MC within a block are preset at lowest E level by a block erase operation.

In the example of the multilevel write operation shown in FIG. 3A, the program of the first stage (1st stage) writes the L (Lower) page. This raises the E-level threshold distribution of the L page to LM (Lower Middle) level.

After that, the program of the second stage (2nd stage) writes the U (Upper) page. This generates the E- or A-level threshold distribution of the U page from the E-level threshold distribution of the L page. On the other hand, the B- or C-level threshold distribution of the U page is generated from the LM-level threshold distribution of the L page.

On the other hand, in the other example of the multilevel write operation shown in FIG. 3B, the program of the first stage (1st stage) roughly writes the L and U pages, and generates the A-, B-, and C-level threshold distributions of the U page from the E-level threshold distribution of the L page. At this time, however, the adjacent A-, B-, and C-level threshold distributions of the U page overlap each other.

After that, the program of the second stage (2nd stage) finely writes the L and U pages. This narrows the A-, B-, and C-level threshold distributions of the U pages which overlap each other after the program of the first stage, thereby clearly separating them.

Figure 4:
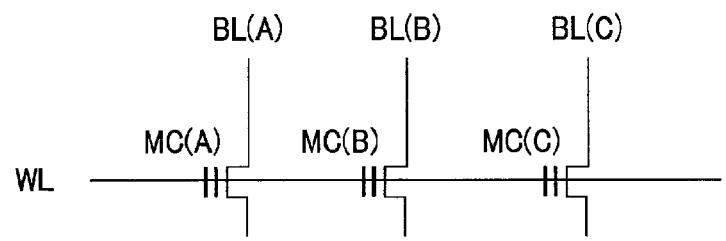
FIG. 4 is a view for explaining the multilevel write operation of the semiconductor memory device according to the first embodiment.
Figure 5:
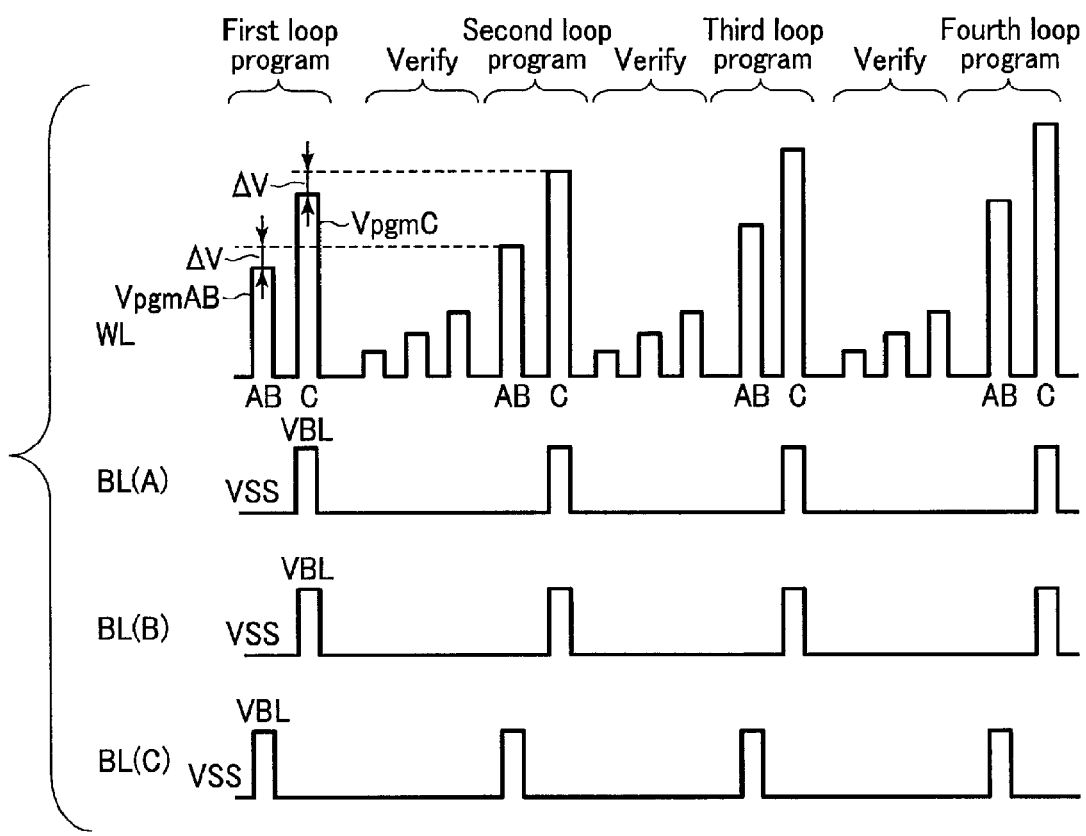
FIG. 5 is a waveform chart showing various voltages in the multilevel write operation of the semiconductor memory device according to the first embodiment.

FIG. 4 is a view for explaining the multilevel write operation of the semiconductor memory device according to the first embodiment. FIG. 5 is a waveform chart showing various voltages in the multilevel write operation of the semiconductor memory device according to the first embodiment. Voltage application in the multilevel write operation shown in FIG. 5 is mainly performed by the program of the second stage shown in FIGS. 3A and 3B.

The write operation includes a plurality of program operations (loop program operations) and a plurality of verify operations.

A case in which one of A-, B-, and C-level data is written to each of the plurality of memory cells MC commonly coupled to one word line WL, as shown in FIG. 4, will be described. In this case, a bit line BL(A) is coupled to a memory cell MC(A) to which A-level data is to be written, a bit line BL(B) is coupled to a memory cell MC(B) to which B-level data is to be written, and a bit line BL(C) is coupled to a memory cell MC(C) to which C-level data is to be written.

As shown in FIG. 5, the first loop program is performed for the A-, B-, and C-level memory cells MC.

More specifically, an A- and B-level program voltage VpgmAB is applied to the word line WL. At this time, the bit lines BL(A) and BL(B) have a voltage VSS (ground voltage). On the other hand, a voltage VBL is applied to the bit line BL(C). In addition, a voltage VSGD is applied to each of the control gates of the selection transistors S1.

With this processing, the channels of the memory cells MC(A) and MC(B) have the voltage VSS, and the memory cells MC(A) and MC(B) are programmed by applying the program voltage VpgmAB to the control gates (word line WL). On the other hand, the selection transistor S1 coupled to the memory cell MC(C) is cut off by applying the voltage VBL to the bit line BL(C). With this processing, the channel of the memory cell MC(C) is set in a floating state, and is boosted. Consequently, even if the program voltage VpgmAB is applied to the control gates (word line WL), the memory cell MC(C) is not programmed.

Subsequently, the C-level program voltage VpgmC is applied to the word line WL. The program voltage VpgmC is higher than the program voltage VpgmAB. At this time, the bit line BL(C) has the voltage VSS. On the other hand, the voltage VBL is applied to the bit lines BL(A) and BL(B). In addition, the voltage VSGD is applied to each of the control gates of the selection transistors S1.

With this processing, the channel of the memory cell MC(C) has the voltage VSS, and the memory cell MC(C) is programmed by applying the program voltage VpgmC to the controls gates (word line WL). On the other hand, the selection transistors S1 coupled to the memory cells MC(A) and MC(B) are cut off by applying the voltage VBL to the bit lines BL(A) and BL(B). With this processing, the channels of the memory cells MC(A) and MC(B) are set in the floating state, and are boosted. Consequently, even if the program voltage VpgmC is applied to the control gates (word line WL), the memory cells MC(A) and MC(B) are not programmed.

A verify operation is performed for the memory cells MC(A), MC(B), and MC(C). More specifically, A-, B-, and C-level verify voltages are sequentially applied to the word line WL.

Next, the second loop program is executed for the A-, B-, and C-level memory cells MC which have not reached desired voltage levels, respectively, in the verify operation.

More specifically, a program voltage (VpgmAB+ΔV) obtained by adding a step-up voltage ΔV to the previous program voltage VpgmAB is applied to the word line WL. At this time, the bit lines BL(A) and BL(B) have the voltage VSS. On the other hand, the voltage VBL is applied to the bit line BL(C). In addition, the voltage VSGD is applied to each of the control gates of the selection transistors S1. Thus, the memory cells MC(A) and MC(B) are programmed, and the memory cell MC(C) is not programmed.

Subsequently, a program voltage (VpgmC+ΔV) obtained by adding the step-up voltage ΔV to the previous program voltage VpgmC is applied to the word line WL. At this time, the bit line BL(C) has the voltage VSS. On the other hand, the voltage VBL is applied to the bit lines BL(A) and BL(B). In addition, the voltage VSGD is applied to each of the control gates of the selection transistors S1. Thus, the memory cell MC(C) is programmed, and the memory cells MC(A) and MC(B) are not programmed.

Next, the verify operation is performed for the memory cells MC(A), MC(B), and MC(C) again. More specifically, the A-, B-, and C-level verify voltages are sequentially applied to the word line WL.

After that, the third loop program is executed for the memory cells MC(A), MC(B), and MC(C) which have not reached the desired voltage levels, respectively, in the verify operation. At this time, program voltages (VpgmAB+2ΔV and VpgmC+2ΔV) obtained by adding the step-up voltage ΔV to the previous program voltages (VpgmAB+ΔV and VpgmC+ΔV) are sequentially applied. The loop program is performed in the same manner until the desired threshold voltage levels are reached in the verify operation.

Effects in First Embodiment

According to a comparative example, a multilevel NAND flash memory includes the plurality of memory cells MC coupled to the common word line WL. The plurality of memory cells MC include, for example, a memory cell MC to which A-level (or B level) data is to be written, and a memory cell MC to which C-level data is to be written. In the write operation, one kind of program voltage is applied to the word line WL, and then the stepped up program voltage is applied. With the program voltage V and the stepped up program voltage, write operations of the A- and C-level memory cells MC are performed.

At this time, although the write operation of the A-level memory cell MC is completed first, the write operation of the C-level memory cell MC is continuously performed. Therefore, even after the completion of the write operation of the A-level memory cell MC, the threshold voltage of the C-level memory cell MC rises. If the rise in threshold voltage of the C-level memory cell MC after the completion of the write operation of the A-level memory cell MC is large, the threshold voltage of the A-level memory cell MC after the completion of the write operation undesirably rises due to coupling with the C-level memory cell MC. As a result, the threshold distribution of the A-level memory cell MC becomes large to cause a problem that the read margin is small or the like, thereby degrading the reliability of the memory.

To cope with this, according to the first embodiment, in a write operation, the two kinds of program voltages VpgmAB and VpgmC are sequentially applied to the word line WL, and the stepped up program voltages (VpgmAB+i$\Delta$V and VpgmC+i$\Delta$V where i is an integer of 2 or more) are sequentially applied to the word line WL. A write operation is performed for the A-level (or B-level) memory cell MC by the program voltage VpgmAB and the stepped up program voltage (VpgmAB+i$\Delta$V), and a write operation is performed for the C-level memory cell MC by the program voltage VpgmC and the stepped up program voltage (VpgmC+i$\Delta$V). The program voltage VpgmC is set to be higher than the program voltage VpgmAB. That is, the write operation for the C-level memory cell MC starts by a voltage higher than that of the write operation of the A-level memory cell MC. This can decrease the difference in write completion timing between the A-level memory cell MC and the C-level memory cell MC. Therefore, it is possible to decrease a rise in threshold voltage of the C-level memory cell MC after the completion of the write operation of the A-level memory cell MC, and solve the above-described problem, thereby improving the reliability of the memory.

Note that in the first embodiment, the same program voltage VpgmAB is applied to the A- and B-level memory cells MC. The present invention, however, is not limited to this. For example, the same program voltage may be applied to the B- and C-level memory cells MC.

Second Embodiment

A semiconductor memory device according to the second embodiment will be described below with reference to FIG. 6.

In the second embodiment, in each loop program, a high C-level program voltage VpgmC is applied to a word line WL, and then a low A-level program voltage VpgmAB is applied to the word line WL. This can improve the reliability of the memory without exerting any influence of the program operation of a C-level memory cell MC on the threshold voltage of an A-level memory cell after completion of the program operation.

The second embodiment will be described in detail below. Note that in the second embodiment, a description of the same points as in the aforementioned first embodiment will be omitted, and different points will mainly be explained.

[Multilevel Write Operation in Second Embodiment]

FIG. 6 is a waveform chart showing various voltages in the multilevel write operation of the semiconductor memory device according to the second embodiment.

As shown in FIG. 6, the first loop program is executed for A-, B-, and C-level memory cells MC.

More specifically, the C-level program voltage VpgmC is applied to the word line WL. At this time, a bit line BL(C) has a voltage VSS. On the other hand, a voltage VBL is applied to bit lines BL(A) and BL(B). In addition, a voltage VSGD is applied to each of the control gates of selection transistors S1. Thus, the memory cell MC(C) is programmed, and the memory cells MC(A) and MC(B) are not programmed.

Subsequently, the A- and B-level program voltage VpgmAB is applied to the word line WL. At this time, the bit lines BL(A) and BL(B) have the voltage VSS. On the other hand, the voltage VBL is applied to the bit line BL(C). In addition, the voltage VSGD is applied to each of the control gates of the selection transistors S1. Thus, the memory cells MC(A) and MC(B) are programmed, and the memory cell MC(C) is not programmed.

A verify operation is performed for the memory cells MC(A), MC(B), and MC(C). More specifically, A-, B-, and C-level verify voltages are sequentially applied to the word line WL.

Next, the second loop program is executed for the A-, B-, and C-level memory cells MC which have not reached desired voltage levels, respectively, in the verify operation. In the second loop program, program voltages (VpgmC+$\Delta$V and VpgmAB+$\Delta$V) obtained by adding a step-up voltage $\Delta$V to the previous program voltages (VpgmC and VpgmAB) are sequentially applied.

The verify operation is performed for the memory cells MC(A), MC(B), and MC(C) again. More specifically, the A-, B-, and C-level verify voltages are sequentially applied to the word line WL.

After that, the third loop program is executed for the memory cells MC(A), MC(B), and MC(C) which have not reached the desired voltage levels, respectively, in the verify operation. At this time, program voltages (VpgmC+2$\Delta$V and VpgmAB+2$\Delta$V) obtained by adding the step-up voltage 4V to the previous program voltages (VpgmC+$\Delta$V and VpgmAB+$\Delta$V) are sequentially applied. The loop program is performed in the same manner until the desired voltage levels are reached in the verify operation.

Effects in Second Embodiment

The threshold voltage of the C-level memory cell MC is higher than that of the A-level (or B-level) memory cell MC. Therefore, in each loop program, if the A-level memory cell MC is programmed and then the C-level memory cell MC is programmed, a rise in threshold voltage of the C-level memory cell MC may significantly influence on the threshold voltage of the A-level memory cell MC after completion of the program operation.

To cope with this, according to the second embodiment, in each loop program, the high C-level program voltage VpgmC is applied to the word line WL, and then the low A-level program voltage VpgmAB is applied to the word line WL. That is, the order of the voltage application operations of the loop programs is reversed, as compared with the first embodiment. By programming the C-level memory cell MC first, the influence is exerted on the threshold voltage of the A-level memory cell before the program operation. After that, the A-level memory cell is programmed. Consequently, there is no influence of the program operation of the C-level memory cell MC on the threshold voltage of the A-level memory cell after completion of the program operation, and it is thus possible to improve the reliability of the memory.

Third Embodiment

A semiconductor memory device according to the third embodiment will be described below with reference to FIG. 7.

In the third embodiment, in an even-numbered loop program, an A- and B-level program voltage VpgmAB is applied to a word line WL, and then a C-level program voltage VpgmC is applied to the word line WL. On the other hand, in an odd-numbered loop program, the C-level program voltage VpgmC is applied to the word line WL, and then the A- and B-level program voltage VpgmAB is applied to the word line WL. This can equalize the program characteristics of the A- and B-level program and those of the C-level program.

The third embodiment will be described in detail below. Note that in the third embodiment, a description of the same points as in the aforementioned first embodiment will be omitted, and different points will mainly be explained.

[Multilevel Write Operation in Third Embodiment]

Figure 7:
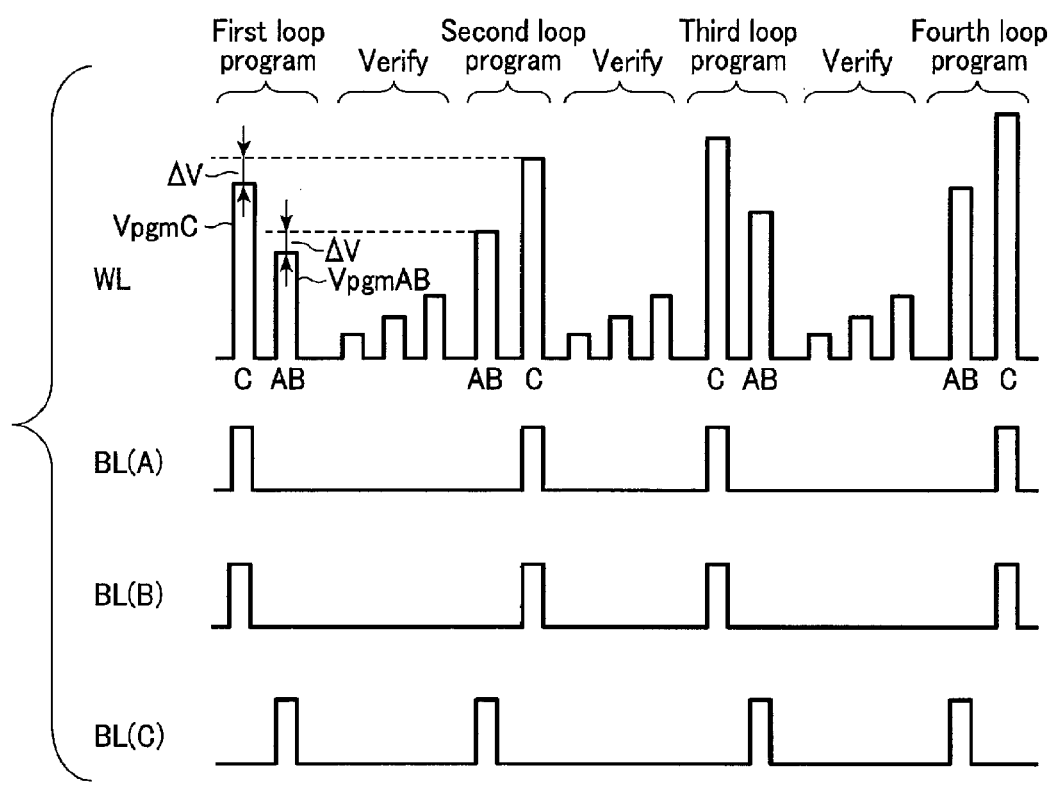
FIG. 7 is a waveform chart showing various voltages in the multilevel write operation of a semiconductor memory device according to the third embodiment.

FIG. 7 is a waveform chart showing various voltages in the multilevel write operation of the semiconductor memory device according to the third embodiment.

As shown in FIG. 7, the first loop program is executed for A-, B-, and C-level memory cells MC.

More specifically, the C-level program voltage VpgmC is applied to the word line WL. At this time, a bit line BL(C) has a voltage VSS. On the other hand, a voltage VBL is applied to bit lines BL(A) and BL(B). In addition, voltage VSGD is applied to each of the control gates of selection transistors S1. Thus, the memory cell MC(C) is programmed, and the memory cells MC(A) and MC(B) are not programmed.

Subsequently, the A- and B-level program voltage VpgmAB is applied to the word line WL. At this time, the bit lines BL(A) and BL(B) have the voltage VSS. On the other hand, the voltage VBL is applied to the bit line BL(C). In addition, the voltage VSGD is applied to each of the control gates of the selection transistors S1. Thus, the memory cells MC(A) and MC(B) are programmed, and the memory cell MC(C) is not programmed.

A verify operation is performed for the memory cells MC(A), MC(B), and MC(C). More specifically, A-, B-, and C-level verify voltages are sequentially applied to the word line WL.

Next, the second loop program is executed for the A-, B-, and C-level memory cells MC which have not reached desired voltage levels, respectively, in the verify operation. In the second loop program, the order of the program operation of the memory cells MC(A) and MC(B) and that of the memory cell MC(C) is reversed, as compared with the first loop program.

More specifically, a program voltage (VpgmAB+ΔV) obtained by adding a step-up voltage ΔV to the previous program voltage VpgmAB is applied to the word line WL. At this time, the bit lines BL(A) and BL(B) have the voltage VSS. On the other hand, the voltage VBL is applied to the bit line BL(C). In addition, the voltage VSGD is applied to each of the control gates of the selection transistors S1. Thus, the memory cells MC(A) and MC(B) are programmed, and the memory cell MC(C) is not programmed.

Subsequently, a C-level program voltage (VpgmC+ΔV) obtained by adding the step-up voltage ΔV to the previous program voltage VpgmC is applied to the word line WL. At this time, the bit line BL(C) has the voltage VSS. On the other hand, the voltage VBL is applied to the bit lines BL(A) and BL(B). In addition, the voltage VSGD is applied to each of the control gates of the selection transistors S1. Thus, the memory cell MC(C) is programmed, and the memory cells MC(A) and MC(B) are not programmed.

Next, the verify operation is performed for the memory cells MC(A), MC(B), and MC(C) again. More specifically, the A-, B-, and C-level verify voltages are sequentially applied to the word line WL.

After that, the third loop program is executed for the memory cells MC(A), MC(B), and MC(C) which have not reached the desired voltage levels, respectively, in the verify operation. In the third loop program, the order of the program operation of the A- and B-level memory cells MC and that of the C-level memory cell MC is reversed (the order is the same as in the first loop program), as compared with the second loop program. At this time, program voltages (VpgmC+2ΔV and VpgmAB+2ΔV) obtained by adding the step-up voltage ΔV to the previous program voltages (VpgmC+ΔV and VpgmAB+ΔV) are sequentially applied. The loop program is performed in the same manner until the desired voltage levels are reached in the verify operation.

Effects in Third Embodiment

According to the third embodiment, in the even-numbered loop program, the A- and B-level program voltage VpgmAB is applied to the word line WL, and then the C-level program voltage VpgmC is applied to the word line WL. On the other hand, in the odd-numbered loop program, the C-level program voltage VpgmC is applied to the word line WL, and then the A- and B-level program voltage VpgmAB is applied to the word line WL. That is, the order of the program operations of the memory cells MC is reversed between the even-numbered loop program and the odd-numbered loop program. This can suppress the deviation of the program characteristics caused by the fixed order of the program operations. That is, it is possible to equalize the program characteristics of the A- and B-level program and those of the C-level program.

Fourth Embodiment

A semiconductor memory device according to the fourth embodiment will be described below with reference to FIGS. 8A and 8B.

According to the fourth embodiment, in the program operation of an even-numbered word line WL(even), an A- and B-level program voltage VpgmAB is applied to the word line WL, and then a C-level program voltage VpgmC is applied to the word line WL. On the other hand, in the program operation of an odd-numbered word line WL(odd), the C-level program voltage VpgmC is applied to the word line WL, and then the A- and B-level program voltage VpgmAB is applied to the word line WL. This can equalize the program characteristics of the adjacent word lines WL when, for example, the program characteristics are different.

The fourth embodiment will be described in detail below. Note that in the fourth embodiment, a description of the same points as in the aforementioned first embodiment will be omitted, and different points will mainly be explained.

[Multilevel Write Operation in Fourth Embodiment]

Figure 8B:
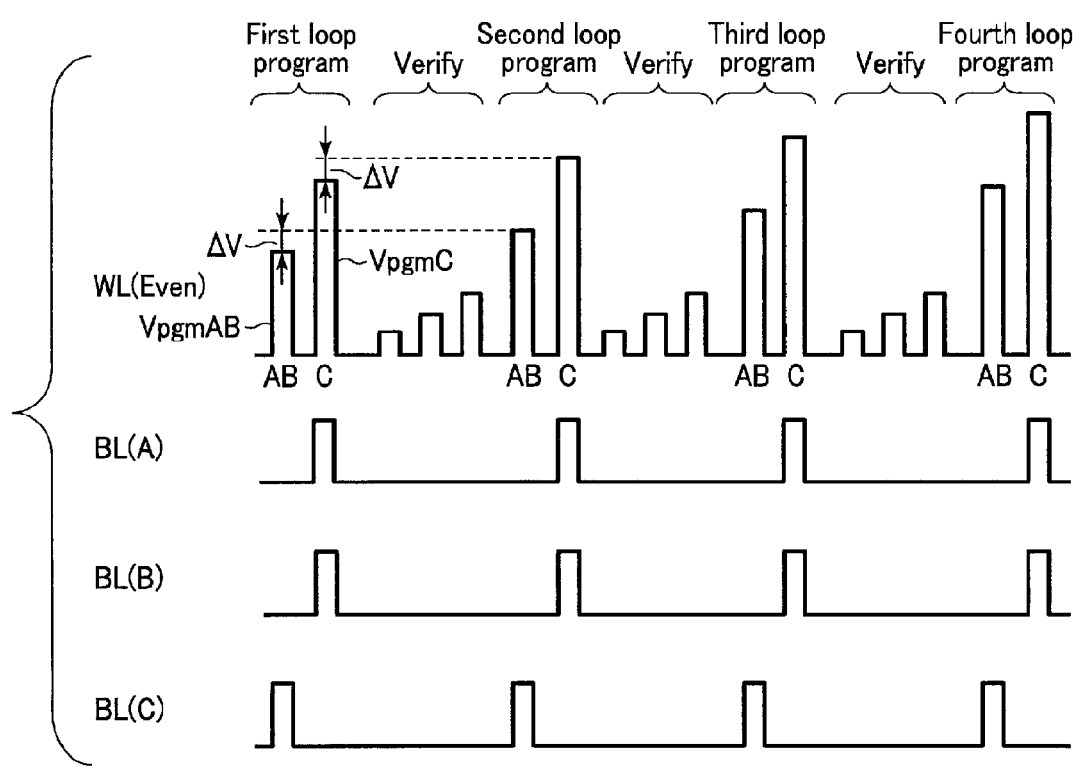
FIG. 8B is a waveform chart showing various voltages in the multilevel write operation for an even-numbered word line of the semiconductor memory device according to the fourth embodiment.

FIG. 8A is a waveform chart showing various voltages in the multilevel write operation for the odd-numbered word line of the semiconductor memory device according to the fourth embodiment. FIG. 8B is a waveform chart showing various voltages in the multilevel write operation for the even-numbered word line of the semiconductor memory device according to the fourth embodiment.

As shown in FIG. 8A, in the multilevel write operation for the odd-numbered word line WL(odd), the first loop program is executed for A-, B-, and C-level memory cells MC.

More specifically, the C-level program voltage VpgmC is applied to the word line WL. At this time, a bit line BL(C) has a voltage VSS. On the other hand, a voltage VBL is applied to bit lines BL(A) and BL(B). In addition, a voltage VSGD is applied to each of the control gates of selection transistors S1. Thus, the memory cell MC(C) is programmed, and the memory cells MC(A) and MC(B) are not programmed.

Subsequently, the A- and B-level program voltage VpgmAB is applied to the word line WL. At this time, the bit lines BL(A) and BL(B) have the voltage VSS. On the other hand, the voltage VBL is applied to the bit line BL(C). In addition, the voltage VSGD is applied to each of the control gates of the selection transistors S1. Thus, the memory cells MC(A) and MC(B) are programmed, and the memory cell MC(C) is not programmed.

That is, the same write operation as in the second embodiment is performed for the odd-numbered word line WL(odd).

On the other hand, as shown in FIG. 8B, in the multilevel write operation for the even-numbered word line WL(even), the first loop program is executed for the A-, B-, and C-level memory cells MC.

More specifically, the A- and B-level program voltage VpgmAB is applied to the word line WL. At this time, the bit lines BL coupled to the memory cells MC(A) and MC(B) have the voltage VSS. On the other hand, the voltage VBL is applied to the bit line BL(C). In addition, the voltage VSGD is applied to each of the control gates of the selection transistors S1. Thus, the memory cells MC(A) and MC(B) are programmed, and the memory cell MC(C) is not programmed.

Subsequently, the C-level program voltage VpgmC is applied to the word line WL. At this time, the bit line BL(C) has the voltage VSS. On the other hand, the voltage VBL is applied to the bit lines BL(A) and BL(B). In addition, the voltage VSGD is applied to each of the control gates of the selection transistors S1. Thus, the memory cell MC(C) is programmed, and the memory cells MC(A) and MC(B) are not programmed.

That is, the same write operation as in the first embodiment is performed for the even-numbered word line WL(even).

Effects in Fourth Embodiment

According to the fourth embodiment, in the program operation of the even-numbered word line WL(even), the A- and B-level program voltage VpgmAB is applies to the word line WL, and then the C-level program voltage VpgmC is applies to the word line WL. On the other hand, in the program operation of the odd-numbered word line WL(odd), the C-level program voltage VpgmC is applies to the word line WL, and then the A- and B-level program voltage VpgmAB is applies to the word line WL. That is, the order of the program operations of the memory cells MC is reversed between the program operation of the even-numbered word line WL(even) and that of the odd-numbered word line WL(odd). This can equalize the program characteristics of the adjacent word lines WL (even-numbered word line WL(even) and odd-numbered word line WL(odd)) when, for example, the program characteristics are different.

Fifth Embodiment

A semiconductor memory device according to the fifth embodiment will be described below with reference to FIG. 9.

In the fifth embodiment, a write operation includes a loop program of executing a program operation by one kind of program voltage Vpgm, and a loop program of executing program operations by two kinds of program voltages VpgmAB and VpgmC. This can improve the reliability of the memory, and shorten the time of the write operation.

The fifth embodiment will be described in detail below. Note that in the fifth embodiment, a description of the same points as in the aforementioned first embodiment will be omitted, and different points will mainly be explained.

[Multilevel Write Operation in Fifth Embodiment]

Figure 9:
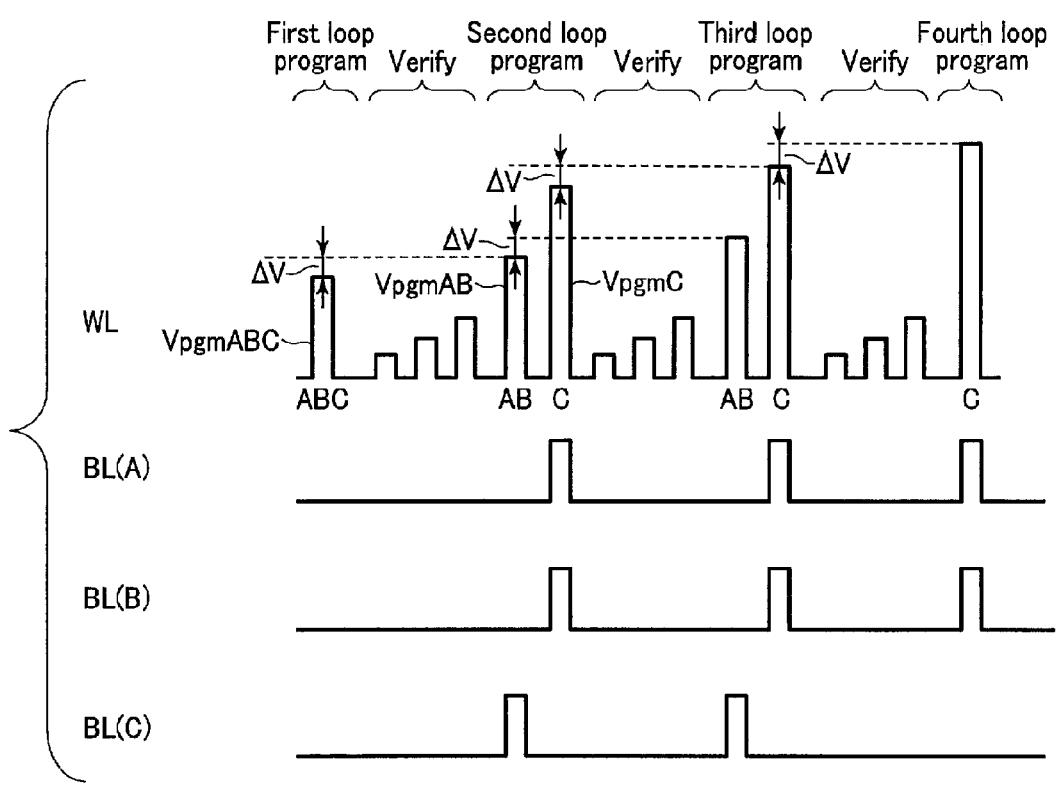
FIG. 9 is a waveform chart showing various voltages in the multilevel write operation of a semiconductor memory device according to the fifth embodiment.

FIG. 9 is a waveform chart showing various voltages in the multilevel write operation of the semiconductor memory device according to the fifth embodiment.

As shown in FIG. 9, the first loop program is executed for A-, B-, and C-level memory cells MC.

More specifically, an A-, B-, and C-level program voltage VpgmABC is applied to a word line WL. At this time, bit lines BL coupled to the memory cells MC(A), MC(B), and MC(C) have a voltage VSS. A voltage VSGD is applied to each of the control gates of selection transistors S1. This programs the memory cells MC(A), MC(B), and MC(C).

That is, in the first loop program, a program operation is executed by the one kind of program voltage VpgmABC.

A verify operation is performed for the memory cells MC(A), MC(B), and MC(C). More specifically, A-, B-, and C-level verify voltages are sequentially applied to the word line WL.

Next, the second loop program is executed for the memory cells MC(A), MC(B), and MC(C) which have not reached desired voltage levels, respectively, in the verify operation.

More specifically, the A- and B-level program voltage VpgmAB (VpgmABC+ΔV) obtained by adding a step-up voltage ΔV to the previous program voltage VpgmABC is applied to the word line WL. At this time, the bit lines BL(A) and BL(B) have the voltage VSS. On the other hand, a voltage VBL is applied to the bit line BL(C). In addition, the voltage VSGD is applied to each of the control gates of the selection transistors S1. Thus, the memory cells MC(A) and MC(B) are programmed, and the memory cell MC(C) is not programmed.

Subsequently, the C-level program voltage VpgmC is applied to the word line WL. The program voltage VpgmC is higher than the program voltage VpgmAB. At this time, the bit line BL(C) has the voltage VSS. On the other hand, the voltage VBL is applied to the bit lines BL(A) and BL(B). In addition, the voltage VSGD is applied to each of the control gates of the selection transistors S1. Thus, the memory cell MC(C) is programmed, and the memory cells MC(A) and MC(B) are not programmed.

That is, in the second loop program, program operations are executed by the two kinds of program voltages VpgmAB and VpgmC.

Next, the verify operation is performed for the memory cells MC(A), MC(B), and MC(C) again. More specifically, the A-, B-, and C-level verify voltages are sequentially applied to the word line WL.

The third loop program is executed for the memory cells MC(A), MC(B), and MC(C) which have not reached the desired voltage levels, respectively, in the verify operation. In the third loop voltage, program voltages (VpgmAB+ΔV and VpgmC+ΔV) obtained by adding the step-up voltage ΔV to the previous program voltages (VpgmAB and VpgmC) are sequentially applied.

The verify operation is performed for the memory cells MC(A), MC(B), and MC(C) again. More specifically, the A-, B-, and C-level verify voltages are sequentially applied to the word line WL.

After that, for example, if only the memory cell MC(C) has not reached the desired voltage level, a C-level program voltage (VpgmC+2ΔV) is applied to the word line WL in the fourth loop program.

That is, in the fourth loop program, a program operation is executed by the one kind of program voltage VpgmC.

Effects in Fifth Embodiment

According to the fifth embodiment, the write operation includes the loop program of executing a program operation by the one kind of program voltage Vpgm, and the loop program of executing program operations by the two kinds of program voltages VpgmAB and VpgmC. It is possible to improve the reliability of the memory by executing program operations by the two kinds of program voltages VpgmAB and VpgmC. Furthermore, it is possible to shorten the time of the write operation by executing a program operation by the one kind of program voltage Vpgm.

Sixth Embodiment

A semiconductor memory device according to the sixth embodiment will be described below with reference to FIGS. 10A, 10B, and 11.

According to the sixth embodiment, in a write operation to a plurality of memory cells MC commonly coupled to a word line WL, two adjacent memory cells MC (two adjacent bit lines BL) are paired, and programs pgm11 and pgm12 are alternately executed for every other pair. This can suppress a rise in threshold voltage caused by a write error in the memory cell MC as a non-program target.

The sixth embodiment will be described in detail below. Note that in the sixth embodiment, a description of the same points as in the aforementioned first embodiment will be omitted, and different points will mainly be explained.

[Multilevel Write Operation in Sixth Embodiment]

Figure 10A:
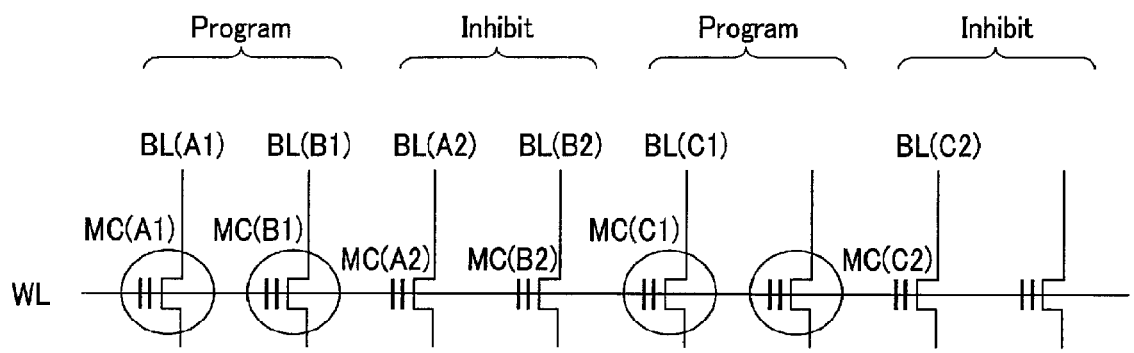
FIG. 10A is a view for explaining the multilevel write operation of a semiconductor memory device according to the sixth embodiment.

FIG. 10A is a view for explaining the multilevel write operation of the semiconductor memory device according to the sixth embodiment, and shows the program pgm11. FIG. 10B is a view for explaining the multilevel write operation of the semiconductor memory device according to the sixth embodiment, and shows the program pgm12. FIG. 11 is a waveform chart showing various voltages in the multilevel write operation of the semiconductor memory device according to the sixth embodiment.

Figure 10B:
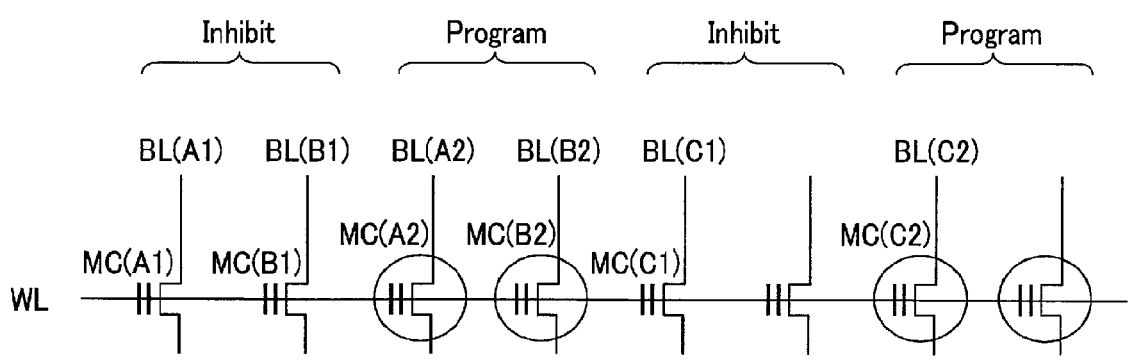
FIG. 10B is a view for explaining the multilevel write operation of the semiconductor memory device according to the sixth embodiment.

A case in which one of A-, B-, and C-level data is written to each of the plurality of memory cells MC commonly coupled to one word line WL, as shown in FIGS. 10A and 10B, will be described. As shown in FIGS. 10A and 10B, in this example, two adjacent memory cells MC (two adjacent bit lines BL) are paired, and the programs pgm11 and pgm12 are alternately performed for every other pair.

The program pgm11 programs one of two adjacent pairs, and inhibits a program operation for the other. Subsequently, the program pgm12 inhibits a program operation for one of the two adjacent pairs, and programs the other. At this time, a voltage VBL is applied to the bit lines BL for which a program operation is inhibited, and channels are boosted.

Note that memory cells MC(A1), MC(B1), and MC(C1) are memory cells MC programmed in the program pgm11, and memory cells MC(A2), MC(B2), and MC(C2) are memory cells programmed in the program pgm12. In addition, bit lines BL(A1), BL(B1), BL(C1), BL(A2), BL(B2), and BL(C2) are coupled to the memory cells MC(A1), MC(B1), MC(C1), MC(A2), MC(B2), and MC(C2), respectively.

When two kinds of program voltages VpgmAB and VpgmC are used, the write scheme is performed as follows.

Figure 11:
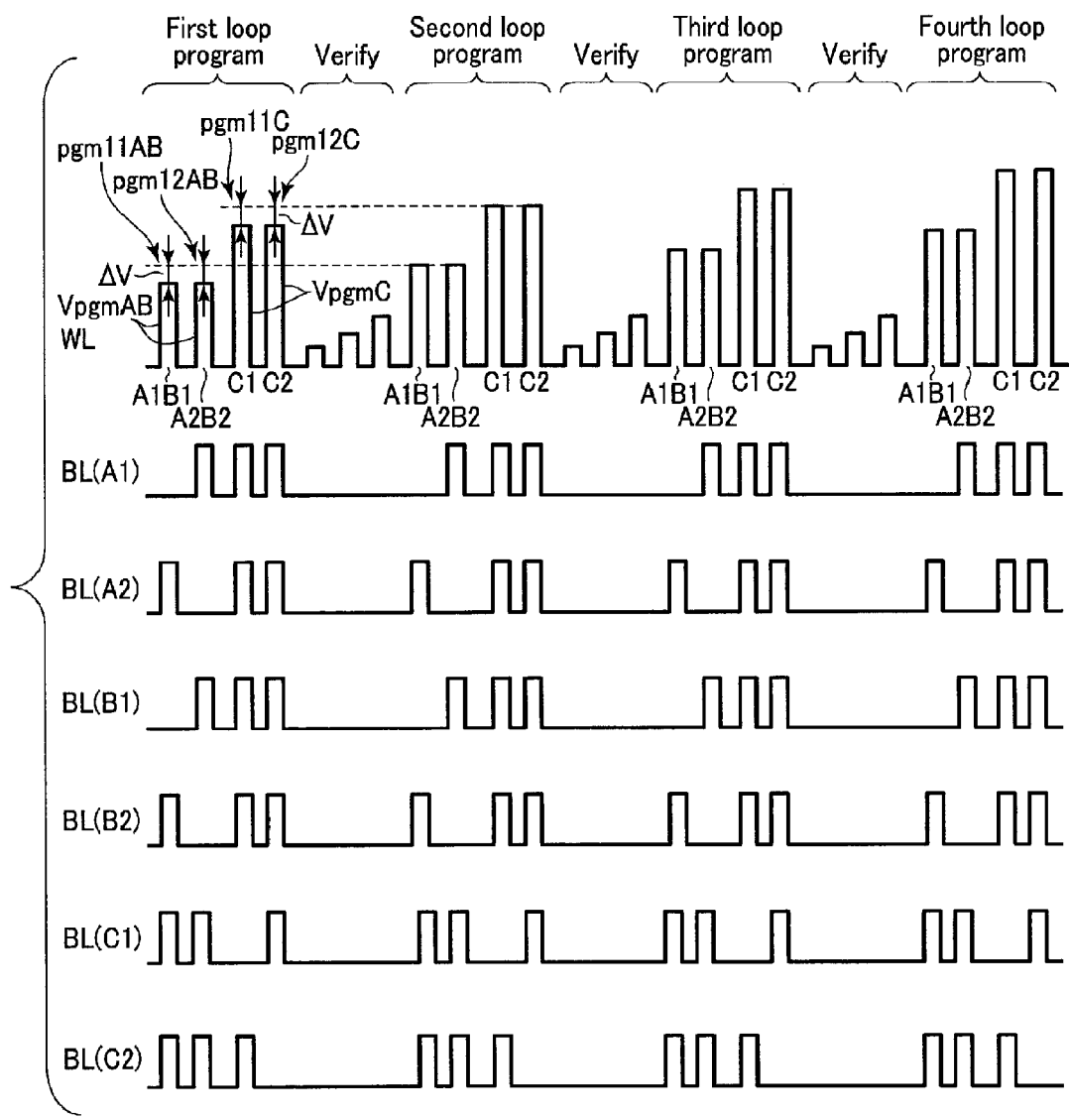
FIG. 11 is a waveform chart showing various voltages in the multilevel write operation of the semiconductor memory device according to the sixth embodiment.

As shown in FIG. 11, the first loop program is executed for the A-, B-, and C-level memory cells MC. In the first loop program, programs pgm11AB, pgm12AB, pgm11C, and pgm12C are sequentially executed.

In this example, the program pgm11AB is the program of the A- and B-level memory cells MC(A1) and MC(B1) in the program pgm11, the program pgm12AB is the program of the A- and B-level memory cells MC(A2) and MC(B2) in the program pgm12, the program pgm11C is the program of the C-level memory cell MC(C1) in the program pgm11, and the program pgm12C is the program of the C-level memory cell MC(C2) in the program pgm12.

More specifically, the A- and B-level program voltage VpgmAB is applied to the word line WL (program pgm11AB). At this time, the bit lines BL(A1) and BL(B1) have a voltage VSS. On the other hand, a voltage VBL is applied to the bit lines BL(A2) and BL(B2). In addition, the voltage VBL is applied to the bit lines BL(C1) and BL(C2). Thus, the memory cells MC(A1) and MC(B1) are programmed, and the memory cells MC(A2), MC(B2), MC(C1), and MC(C2) are not programmed.

Subsequently, the A- and B-level program voltage VpgmAB is applied to the word line WL (program pgm12AB). At this time, the bit lines BL(A2) and BL(B2) have the voltage VSS. On the other hand, the voltage VBL is applied to the bit lines BL(A1) and BL(B1). In addition, the voltage VBL is applied to the bit lines BL(C1) and BL(C2). Thus, the memory cells MC(A2) and MC(B2) are programmed, and the memory cells MC(A1), MC(B1), MC(C1), and MC(C2) are not programmed.

Subsequently, the C-level program voltage VpgmC is applied to the word line WL (program pgm11C). At this time, the bit line BL(C1) has the voltage VSS. On the other hand, the voltage VBL is applied to the bit line BL(C2). In addition, the voltage VBL is applied to the bit lines BL(A1), BL(A2), BL(B1), and BL(B2). Thus, the memory cell MC(C1) is programmed, and the memory cells MC(A1), MC(A2), MC(B1), MC(B2), and MC(C2) are not programmed.

Subsequently, the C-level program voltage VpgmC is applied to the word line WL (program pgm12C). At this time, the bit line BL(C2) has the voltage VSS. On the other hand, the voltage VBL is applied to the bit line BL(C1). In addition, the voltage VBL is applied to the bit lines BL(A1), BL(A2), BL(B1), and BL(B2). Thus, the memory cell MC(C2) is programmed, and the memory cells MC(A1), MC(A2), MC(B1), MC(B2), and MC(C1) are not programmed.

A verify operation is performed for the memory cells MC(A), MC(B), and MC(C). More specifically, A-, B-, and C-level verify voltages are sequentially applied to the word line WL.

Next, the second loop program is executed for the A-, B-, and C-level memory cells MC which have not reached desired voltage levels, respectively, in the verify operation. In the second loop program, program voltages (VpgmAB+ΔV and VpgmC+ΔV) obtained by adding a step-up voltage ΔV to the previous program voltages (VpgmAB and VpgmC) are sequentially applied.

Next, the verify operation is performed for the memory cells MC(A), MC(B), and MC(C) again. More specifically, the A-, B-, and C-level verify voltages are sequentially applied to the word line WL.

After that, the third loop program is executed for the memory cells MC(A), MC(B), and MC(C) which have not reached the desired voltage levels, respectively, in the verify operation. At this time, program voltages (VpgmAB+2ΔV and VpgmC+2ΔV) obtained by adding the step-up voltage ΔV to the previous program voltages (VpgmAB+ΔV and VpgmC+ΔV) are sequentially applied. The loop program is performed in the same manner until the desired voltage levels are reached in the verify operation.

Effects in Sixth Embodiment

According to the sixth embodiment, in a write operation to the plurality of memory cells MC commonly coupled to the word line WL, two adjacent memory cells MC (two adjacent bit lines BL) are paired, and the programs pgm11 and pgm12 are alternately executed for every other pair. With this processing, the adjacent memory cell MC on at least one side of the memory cell MC as a non-program target is a program inhibit cell. Consequently, since the channel of the memory cell MC as a non-program target is boosted together with the program inhibit cell, it is easy to maintain a high boost potential of the channel of the memory cell MC as a non-program target, and it is possible to suppress a rise in threshold voltage caused by a write error.

Seventh Embodiment

A semiconductor memory device according to the seventh embodiment will be described below with reference to FIGS. 12A, 12B, and 13.

According to the seventh embodiment, in a write operation to a plurality of memory cells MC commonly coupled to a word line WL, programs pgm21 and pgm22 are alternately performed for groups of every two memory cells MC (even-numbered memory cells MC and odd-numbered memory cells MC). This prevents the memory cells MC from being programmed too much (prevents a threshold voltage from being raised too much). Therefore, it is possible to narrow the distribution width of the threshold voltage.

The seventh embodiment will be described in detail below. Note that in the seventh embodiment, a description of the same points as in the aforementioned first embodiment will be omitted, and different points will mainly be explained.

[Multilevel Write Operation in Seventh Embodiment]

FIG. 12A is a view for explaining the multilevel write operation of the semiconductor memory device according to the seventh embodiment, and shows the program pgm21. FIG. 12B is a view for explaining the multilevel write operation of the semiconductor memory device according to the seventh embodiment, and shows the program pgm22. FIG. 13 is a waveform chart showing various voltages in the multilevel write operation of the semiconductor memory device according to the seventh embodiment.

A case in which one of A-, B-, and C-level data is written to each of the plurality of memory cells MC commonly coupled to one word line WL, as shown in FIGS. 12A and 12B, will be described. As shown in FIGS. 12A and 12B, in this example, the programs pgm21 and pgm22 are alternately performed for the every two memory cells MC.

The program pgm21 programs one of the groups of every two memory cells MC (for example, the odd-numbered memory cells MC), and inhibits a program operation for the other (for example, the even-numbered memory cells MC). Subsequently, the program pgm22 inhibits a program operation for one of the groups of every two memory cells MC, and programs the other. At this time, a voltage VBL is applied to bit lines BL for which a program operation is inhibited, and channels are boosted.

When two kinds of program voltages VpgmAB and VpgmC are used, the write scheme is performed as follows.

As shown in FIG. 13, the first loop program is executed for the A-, B-, and C-level memory cells MC. In the first loop program, programs pgm21AB, pgm22AB, pgm21C, and pgm22C are sequentially executed.

In this example, the program pgm21AB is the program of the A- and B-level memory cells MC in the program pgm21, the program pgm22AB is the program of the A- and B-level memory cells MC in the program pgm22, the program pgm21C is the program of the C-level memory cell MC in the program pgm21, and the program pgm22C is the program of the C-level memory cell MC in the program pgm22.

More specifically, the A- and B-level program voltage VpgmAB is applied to the word line WL (program pgm21AB). At this time, bit lines BL(A1) and BL(B1) have a voltage VSS. On the other hand, a voltage VBL is applied to bit lines BL(A2) and BL(B2). In addition, the voltage VBL is applied to the bit lines BL(C1) and BL(C2). Thus, the memory cells MC(A1) and MC(B1) are programmed, and the memory cells MC(A2), MC(B2), MC(C1), and MC(C2) are not programmed.

Subsequently, the A- and B-level program voltage VpgmAB is applied to the word line WL (program pgm22AB). At this time, the bit lines BL(A2) and BL(B2) have the voltage VSS. On the other hand, the voltage VBL is applied to the bit lines BL(A1) and BL(B1). In addition, the voltage VBL is applied to the bit lines BL(C1) and BL(C2). Thus, the memory cells MC(A2) and MC(B2) are programmed, and the memory cells MC(A1), MC(B1), MC(C1), and MC(C2) are not programmed.

Subsequently, the C-level program voltage VpgmC is applied to the word line WL (program pgm21C). At this time, the bit line BL(C1) has the voltage VSS. On the other hand, the voltage VBL is applied to the bit line BL(C2). In addition, the voltage VBL is applied to the bit lines BL(A1), BL(A2), BL(B1), and BL(B2). Thus, the memory cell MC(C1) is programmed, and the memory cells MC(A1), MC(A2), MC(B1), MC(B2), and MC(C2) are not programmed.

Subsequently, the C-level program voltage VpgmC is applied to the word line WL (program pym22C). At this time, the bit line BL(C2) has the voltage VSS. On the other hand, the voltage VBL is applied to the bit line BL(C1). In addition, the voltage VBL is applied to the bit lines BL(A1), BL(A2), BL(B1), and BL(B2). Thus, the memory cell MC(C2) is programmed, and the memory cells MC(A1), MC(A2), MC(B1), MC(B2), and MC(C1) are not programmed.

A verify operation is performed for the memory cells MC(A), MC(B), and MC(C). More specifically, A-, B-, and C-level verify voltages are sequentially applied to the word line WL.

Next, the second loop program is executed for the memory cells MC(A), MC(B), and MC(C) which have not reached desired voltage levels, respectively, in the verify operation. In the second loop program, program voltages (VpgmAB+ΔV and VpgmC+ΔV) obtained by adding a step-up voltage ΔV to the previous program voltages (VpgmAB and VpgmC) are sequentially applied.

Next, the verify operation is performed for the memory cells MC(A), MC(B), and MC(C) again. More specifically, the A-, B-, and C-level verify voltages are sequentially applied to the word line WL.

After that, the third loop program is executed for the memory cells MC(A), MC(B), and MC(C) which have not reached the desired voltage levels, respectively, in the verify operation. At this time, program voltages (VpgmAB+2ΔV and VpgmC+2ΔV) obtained by adding the step-up voltage ΔV to the previous program voltages (VpgmAB+ΔV and VpgmC+ΔV) are sequentially applied. The loop program is performed in the same manner until the desired voltage levels are reached in the verify operation.

Effects in Seventh Embodiment

In a write operation to the plurality of memory cells MC commonly coupled to the word line WL, the programs pgm21 and pgm22 are alternately executed for the groups of every two memory cells MC (even-numbered memory cells MC and odd-numbered memory cells MC). Thus, the memory cells MC on both sides of the memory cell MC as a program target are set as program inhibit cells. Consequently, the channels of the memory cells MC on both sides are always in a boost state during the program operation of the memory cell MC. That is, since the channels of the memory cells MC on both sides are never abruptly boosted, the program voltage of the control gate of the memory cell MC currently programmed never rises due to coupling with the channels of the memory cells MC on both sides, and thus the memory cell MC is never programmed too much (the threshold voltage is never raised too much). Therefore, it is possible to narrow the distribution width of the threshold voltage.

Eighth Embodiment

A semiconductor memory device according to the eighth embodiment will be described below with reference to FIGS. 14A, 14B, 14C, and 15.

According to the eighth embodiment, in a write operation to a plurality of memory cells MC commonly coupled to a word line WL, programs pgm31, pgm32, and pgm33 are sequentially executed for groups of every three memory cells MC. This makes it possible to obtain the same effects as in the sixth embodiment.

The eighth embodiment will be described in detail below. Note that in the eighth embodiment, a description of the same points as in the aforementioned first embodiment will be omitted, and different points will mainly be explained.

[Multilevel Write Operation in Eighth Embodiment]

FIG. 14A is a view for explaining the multilevel write operation of the semiconductor memory device according to the eighth embodiment, and shows the program pgm31. FIG. 14B is a view for explaining the multilevel write operation of the semiconductor memory device according to the eighth embodiment, and shows the program pgm32. FIG. 14C is a view for explaining the multilevel write operation of the semiconductor memory device according to the eighth embodiment, and shows the program pgm33.

FIG. 15 is a waveform chart showing various voltages in the multilevel write operation of the semiconductor memory device according to the eighth embodiment.

A case in which one of A-, B-, and C-level data is written to each of the plurality of memory cells MC commonly coupled to one word line WL, as shown in FIGS. 14A, 14B, and 14C, will be described. As shown in FIGS. 14A, 14B, and 14C, in this example, the programs pgm31, pgm32, and pgm33 are sequentially executed for the groups of every three memory cells MC (three groups of memory cells MC).

The program pgm31 programs the first group of every three memory cells MC, and inhibits a program operation for the second and third groups. Subsequently, the program pgm32 programs the second group of every three memory cells MC, and inhibits a program operation for the first and third groups. After that, the program pgm33 programs the third group of every three memory cells MC, and inhibits a program operation for the first and second groups. At this time, a voltage VBL is applied to the bit lines BL for which a program operation is inhibited, and channels are boosted.

When two kinds of program voltages VpgmAB and VpgmC are used, the write scheme is performed as follows.

As shown in FIG. 15, the first loop program is executed for the A-, B-, and C-level memory cells MC. In the first loop program, programs pgm31AB, pgm32AB, pgm33AB, pgm31C, pgm32C, and pgm33C are sequentially executed.

In this example, the program pgm31AB is the program of the A- and B-level memory cells MC in the program pgm31, the program pgm32AB is the program of the A- and B-level memory cells MC in the program pgm32, the program pgm33AB is the program of the A- and B-level memory cells MC in the program pgm33, the program pgm31C is the program of the C-level memory cell MC in the program pgm31, the program pgm32C is the program of the C-level memory cell MC in the program pgm32, and the program pgm33C is the program of the C-level memory cell MC in the program pgm33.

More specifically, the A- and B-level program voltage VpgmAB is applied to the word line WL (program pgm31AB). At this time, bit lines BL(A1) and BL(B1) have a voltage VSS. On the other hand, the voltage VBL is applied to bit lines BL(A2), BL(A3), BL(B2) and BL(B3). In addition, the voltage VBL is applied to bit lines BL(C1), BL(C2), BL(C3). Thus, the memory cells MC(A1) and MC(B1) are programmed, and the memory cells MC(A2), MC(A3), MC(B2), MC(B3), MC(C1), and MC(C2) are not programmed.

Subsequently, the A- and B-level program voltage VpgmAB is applied to the word line WL (program pgm32AB). At this time, the bit lines BL(A2) and BL(B2) have the voltage VSS. On the other hand, the voltage VBL is applied to the bit lines BL(A1), BL(A3), BL(B1), and BL(B3). In addition, the voltage VBL is applied to the bit lines BL(C1), BL(C2), BL(C3). Thus, the memory cells MC(A2) and MC(B2) are programmed, and the memory cells MC(A1), MC(A3), MC(B1), MC(B3), MC(C1), and MC(C2) are not programmed.

Subsequently, the A- and B-level program voltage VpgmAB is applied to the word line WL (program pgm32AB). At this time, the bit lines BL(A3) and BL(B3) have the voltage VSS. On the other hand, the voltage VBL is applied to the bit lines BL(A1), BL(A2), BL(B1), and BL(B2). In addition, the voltage VBL is applied to the bit lines BL(C1), BL(C2), BL(C3). Thus, the memory cells MC(A3) and MC(B3) are programmed, and the memory cells MC(A1), MC(A2), MC(B1), MC(B2), MC(C1), and MC(C2) are not programmed.

Subsequently, the C-level program voltage VpgmC is applied to the word line WL (program pgm31C). At this time, the bit line BL(C1) has the voltage VSS. On the other hand, the voltage VBL is applied to the bit lines BL(C2) and BL(C3). In addition, the voltage VBL is applied to the bit lines BL(A1), BL(A2), BL(A3), BL(B1), BL(B2), and BL(B3). Thus, the memory cell MC(C1) is programmed, and the memory cells MC(A1), MC(A2), MC(A3), MC(B1), MC(B2), MC(B3), MC(C2), and MC(C3) are not programmed.

Subsequently, the C-level program voltage VpgmC is applied to the word line WL (program pgm32C). At this time, the bit line BL(C2) has the voltage VSS. On the other hand, the voltage VBL is applied to the bit lines BL(C1) and BL(C3). In addition, the voltage VBL is applied to the bit lines BL(A1), BL(A2), BL(A3), BL(B1), BL(B2), and BL(B3). Thus, the memory cell MC(C2) is programmed, and the memory cells MC(A1), MC(A2), MC(A3), MC(B1), MC(B2), MC(B3), MC(C1), and MC(C3) are not programmed.

Subsequently, the C-level program voltage VpgmC is applied to the word line WL (program pgm33C). At this time, the bit line BL(C3) has the voltage VSS. On the other hand, the voltage VBL is applied to the bit lines BL(C1) and BL(C2). In addition, the voltage VBL is applied to the bit lines BL(A1), BL(A2), BL(A3), BL(B1), BL(B2), and BL(B3). Thus, the memory cell MC(C3) is programmed, and the memory cells MC(A1), MC(A2), MC(A3), MC(B1), MC(B2), MC(B3), MC(C1), and MC(C2) are not programmed.

A verify operation is performed for the memory cells MC(A), MC(B), and MC(C). More specifically, A-, B-, and C-level verify voltages are sequentially applied to the word line WL.

Next, the second loop program is executed for the A-, B-, and C-level memory cells MC which have not reached desired voltage levels, respectively, in the verify operation. In the second loop program, program voltages (VpgmAB+$\Delta$V and VpgmC+$\Delta$V) obtained by adding a step-up voltage $\Delta$V to the previous program voltages (VpgmAB and VpgmC) are sequentially applied.

Next, the verify operation is performed for the memory cells MC(A), MC(B), and MC(C) again. More specifically, the A-, B-, and C-level verify voltages are sequentially applied to the word line WL.

After that, the third loop program is executed for the A-, B-, and C-level memory cells MC which have not reached the desired voltage levels, respectively, in the verify operation. At this time, program voltages (VpgmAB+2$\Delta$V and VpgmC+2$\Delta$V) obtained by adding the step-up voltage $\Delta$V to the previous program voltages (VpgmAB+$\Delta$V and VpgmC+$\Delta$V) are sequentially applied. The loop program is performed in the same manner until the desired voltage levels are reached in the verify operation.

Effects in Eighth Embodiment

According to the eighth embodiment, in a write operation to the plurality of memory cells MC commonly coupled to the word line WL, the programs pgm31, pgm32, and pgm33 are sequentially executed for the groups of every three memory cells MC. This makes it possible to obtain the same effects as in the sixth embodiment.

Ninth Embodiment

A semiconductor memory device according to the ninth embodiment will be described below with reference to FIG. 16.

In the aforementioned embodiments, in a write operation, the two kinds of program voltages VpgmAB and VpgmC are sequentially applied to the word line WL. To the contrary, in the ninth embodiment, three kinds of program voltages VpgmA, VpgmB, and VpgmC are sequentially applied to a word line WL. This can further improve the reliability of the memory.

The ninth embodiment will be described in detail below. Note that in the ninth embodiment, a description of the same points as in the aforementioned embodiments will be omitted, and different points will mainly be explained.

[Multilevel Write Operation in Ninth Embodiment]

Figure 16:
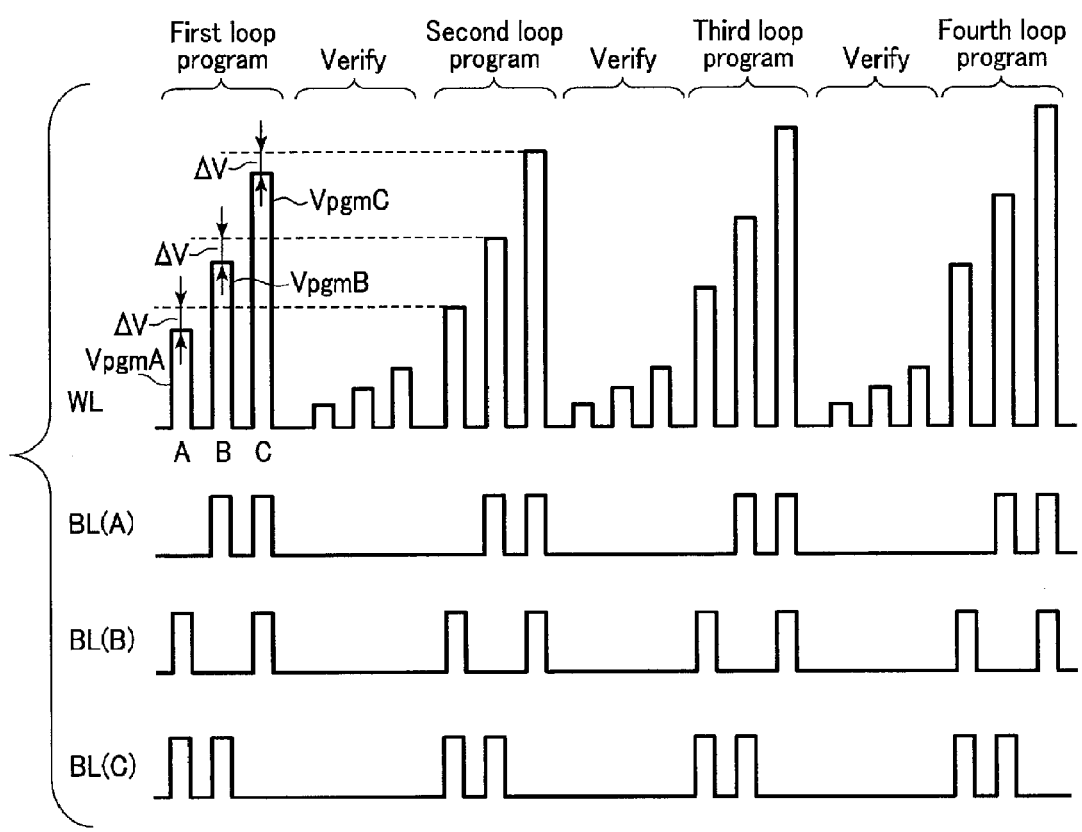
FIG. 16 is a waveform chart showing various voltages in the multilevel write operation of a semiconductor memory device according to the ninth embodiment.

FIG. 16 is a waveform chart showing various voltages in the multilevel write operation of the semiconductor memory device according to the ninth embodiment.

As shown in FIG. 16, the first loop program is executed for A-, B-, and C-level memory cells MC.

More specifically, the A-level program voltage VpgmA is applied to the word line WL. At this time, a bit line BL(A) has a voltage VSS. On the other hand, a voltage VBL is applied to bit lines BL(B) and BL(C). Thus, the memory cell MC(A) is programmed, and the memory cells MC(B) and MC(C) are not programmed.

Subsequently, the B-level program voltage VpgmB is applied to the word line WL. At this time, the bit line BL(B) has the voltage VSS. On the other hand, the voltage VBL is applied to the bit lines BL(A) and BL(C). Thus, the memory cell MC(B) is programmed, and the memory cells MC(A) and MC(C) are not programmed.

Subsequently, the C-level program voltage VpgmC is applied to the word line WL. At this time, the bit line BL(C) has the voltage VSS. On the other hand, the voltage VBL is applied to the bit lines BL(A) and BL(B). Thus, the memory cell MC(C) is programmed, and the memory cells MC(A) and MC(B) are not programmed.

A verify operation is performed for the memory cells MC(A), MC(B), and MC(C). More specifically, A-, B-, and C-level verify voltages are sequentially applied to the word line WL.

Next, the second loop program is executed for the memory cells MC(A), MC(B), and MC(C) which have not reached desired voltage levels, respectively, in the verify operation. In the second loop program, program voltages (VpgmA+$\Delta$V, VpgmB+$\Delta$V, and VpgmC+$\Delta$V) obtained by adding a step-up voltage $\Delta$V to the previous program voltages (VpgmA, VpgmB, and VpgmC) are sequentially applied.

The verify operation is performed for the memory cells MC(A), MC(B), and MC(C) again. More specifically, the A-, B-, and C-level verify voltages are sequentially applied to the word line WL.

After that, the third loop program is executed for the memory cells MC(A), MC(B), and MC(C) which have not reached the desired voltage levels, respectively, in the verify operation. At this time, program voltages (VpgmA+2$\Delta$V, VpgmB+2$\Delta$V, and VpgmC+2$\Delta$V) obtained by adding the step-up voltage $\Delta$V to the previous program voltages (VpgmA+$\Delta$V, VpgmB+$\Delta$V, and VpgmC+$\Delta$V) are sequentially applied. The loop program is performed in the same manner until the desired voltage levels are reached in the verify operation.

Effects in Ninth Embodiment

According to the ninth embodiment, the three kinds of program voltages VpgmA, VpgmB, and VpgmC are sequentially applied to the word line WL. This can decrease the difference in write completion timing between the A-level memory cell MC and the B-level memory cell MC. Therefore, it is possible to decrease a rise in threshold voltage of the B-level memory cell MC after completion of the write operation of the A-level memory cell MC, thereby further improving the reliability of the memory.

10th Embodiment

In the 10th embodiment, in each loop program, three kinds of program voltages VpgmC, VpgmB, and VpgmA are sequentially applied to a word line WL. This prevents the influence of the program operation of a C-level memory cell MC on the threshold voltages of the A- and B-level memory cells after completion of program operations, thereby improving the reliability of a memory.

The 10th embodiment will be described in detail below. Note that in the 10th embodiment, a description of the same points as in the aforementioned ninth embodiment will be omitted, and different points will mainly be explained.

[Multilevel Write Operation in 10th Embodiment]

Figure 17:
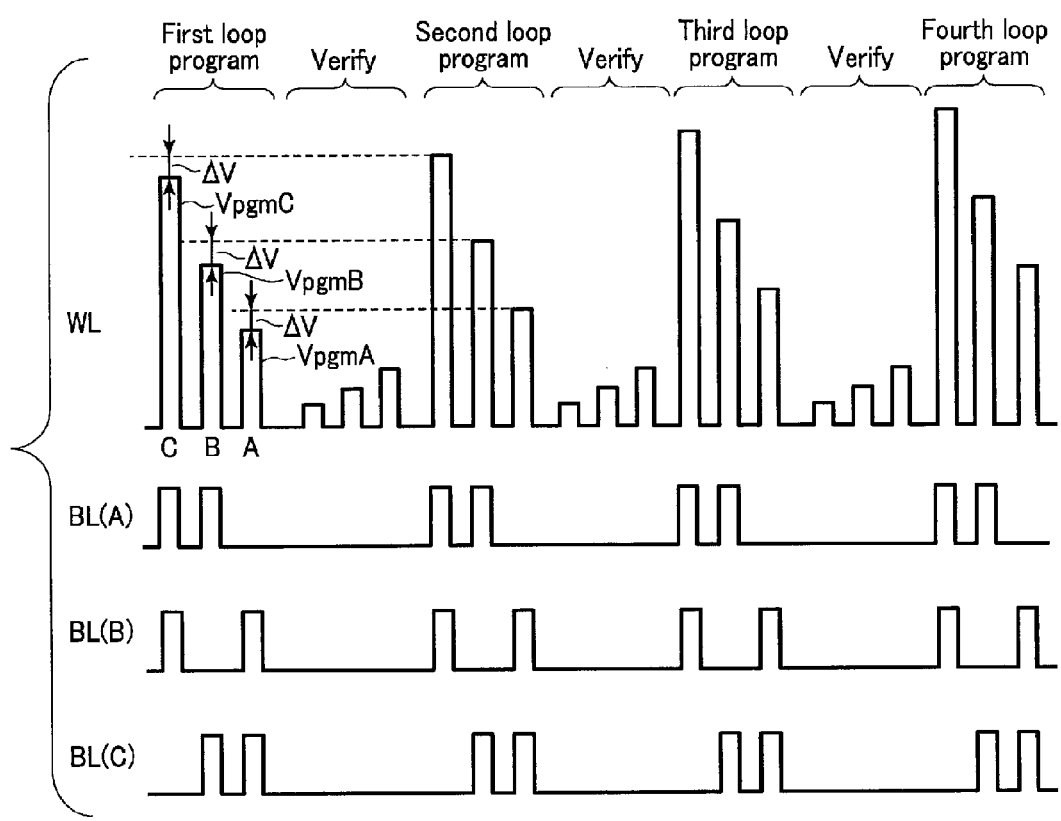
FIG. 17 is a waveform chart showing various voltages in the multilevel write operation of a semiconductor memory device according to the 10th embodiment.

FIG. 17 is a waveform chart showing various voltages in the multilevel write operation of a semiconductor memory device according to the 10th embodiment.

As shown in FIG. 17, the first loop program is executed for the A-, B-, and C-level memory cells MC.

More specifically, the C-level program voltage VpgmC is applied to the word line WL. At this time, a bit line BL(C) has a voltage VSS. On the other hand, a voltage VBL is applied to bit lines BL(A) and BL(B). Thus, the memory cell MC(C) is programmed, and the memory cells MC(A) and MC(B) are not programmed.

Subsequently, the B-level program voltage VpgmB is applied to the word line WL. At this time, the bit line BL(B) has the voltage VSS. On the other hand, the voltage VBL is applied to the bit lines BL(A) and BL(C). Thus, the memory cell MC(B) is programmed, and the memory cells MC(A) and MC(C) are not programmed.

Subsequently, the A-level program voltage VpgmA is applied to the word line WL. At this time, the bit line BL(A) has the voltage VSS. On the other hand, the voltage VBL is applied to the bit lines BL(B) and BL(C). Thus, the memory cell MC(A) is programmed, and the memory cells MC(B) and MC(C) are not programmed.

A verify operation is performed for the A-, B-, and C-level memory cells MC. More specifically, A-, B-, and C-level verify voltages are sequentially applied to the word line WL.

Next, the second loop program is executed for the A-, B-, and C-level memory cells MC which have not reached desired voltage levels, respectively, in the verify operation. In the second loop program, program voltages (VpgmC+ΔV, VpgmB+ΔV, and VpgmA+ΔV) obtained by adding a step-up voltage ΔV to the previous program voltages (VpgmC, VpgmB, and VpgmA) are sequentially applied.

The verify operation is performed for the A-, B-, and C-level memory cells MC again. More specifically, the A-, B-, and C-level verify voltages are sequentially applied to the word line WL.

After that, the third loop program is executed for the A-, B-, and C-level memory cells MC which have not reached the desired voltage levels, respectively, in the verify operation. At this time, program voltages (VpgmC+2ΔV, VpgmB+2ΔV, and VpgmA+2ΔV) obtained by adding the step-up voltage ΔV to the previous program voltages (VpgmC+ΔV, VpgmB+ΔV, and VpgmA+ΔV) are sequentially applied. The loop program is performed in the same manner until the desired voltage levels are reached in the verify operation.

Effects in 10th Embodiment

According to the 10th embodiment, in each loop program, the three kinds of program voltages VpgmC, VpgmB, and VpgmA are sequentially applied to the word line WL. That is, the order of voltage application operations of the loop programs is reversed, as compared with the ninth embodiment. By programming the C-level memory cell MC first, the influence is exerted on the threshold voltages of the A- and B-level memory cells before the program operations. After that, the program operations of the A- and B-level memory cells are performed. Consequently, there is no influence of the program operation of the C-level memory cell MC on the threshold voltages of the A- and B-level memory cells after completion of the program operations, and it is thus possible to improve the reliability of the memory.

Figure 18:
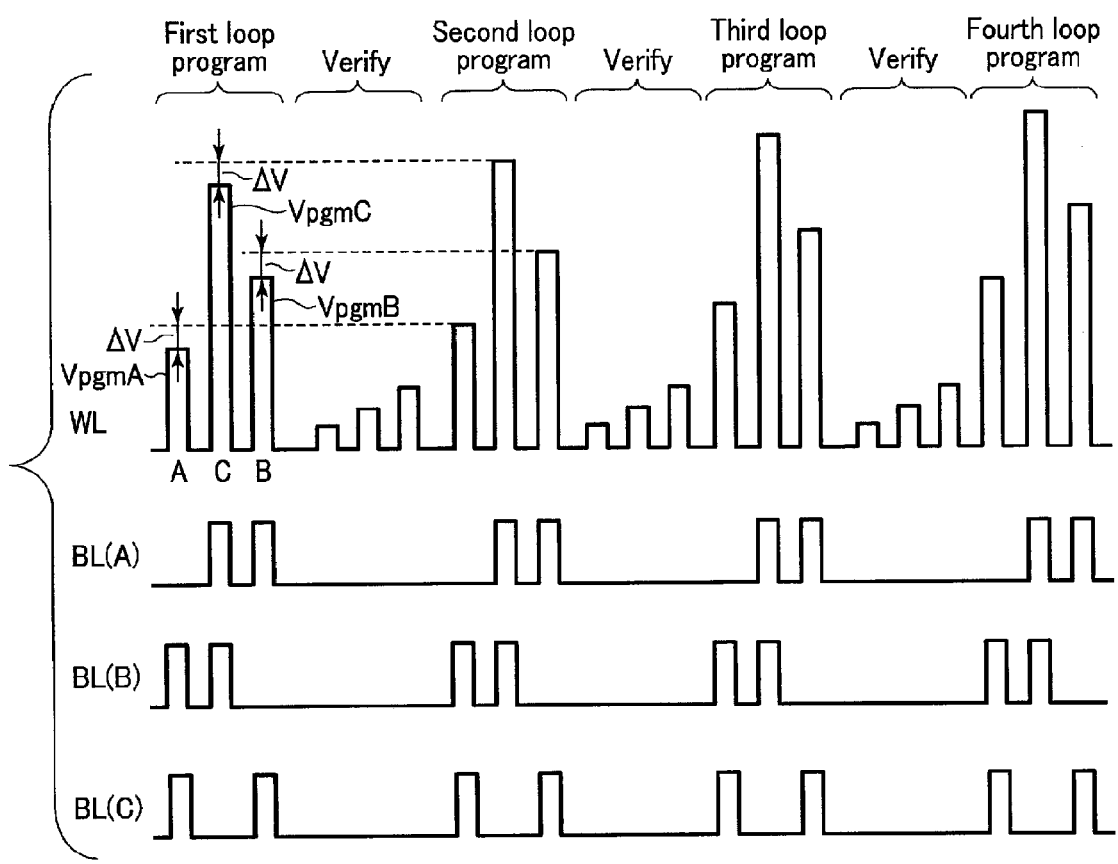
FIG. 18 is a waveform chart showing various voltages in the multilevel write operation of a semiconductor memory device according to a modification of the 10th embodiment.

Note that unlike the 10th embodiment, the order of voltage application operations in respective loop programs need not be reversed, as compared with that in the ninth embodiment. As shown in FIG. 18, the program voltages VpgmA, VpgmC, and VpgmB may be sequentially applied in the order named.

Although a 4-level (2-bit) write operation has been exemplified as a multilevel write operation, 8-, or 16-, or higher-level write operation may be performed. In this case, if three kinds of program voltages Vpgm are used, the program voltage Vpgm to be applied to the memory cell MC of each level may be set, as needed. Alternatively, four or more kinds of program voltages Vpgm may be used. The aforementioned embodiments may be combined as far as possible.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory cell, a second memory cell, and a third memory cell;
a first word line coupled to the first memory cell, the second memory cell, and the third memory cell;
a first bit line coupled to the first memory cell;
a second bit line coupled to the second memory cell;
a third bit line coupled to the third memory cell; and
a controller configured to apply voltages to the first word line, first bit line, second bit line, and third bit line,
wherein the controller applies a first voltage, a second voltage, and a third voltage to the first word line sequentially in a write operation,
the controller applies a fourth voltage to the first bit line when applying the first voltage to the first word line, the controller applies the fourth voltage to the second bit line when applying the second voltage to the first word line, and the controller applies the fourth voltage to the third bit line when applying the third voltage to the first word line, and the first voltage is higher than the second voltage, and the second voltage is higher than the third voltage.

2. The semiconductor memory device of claim 1, wherein in the write operation, before applying the first voltage, the second voltage, and the third voltage to the first word line, the controller applies a fifth voltage lower than the first voltage, the second voltage, and the third voltage to the first word line, and when applying the fifth voltage to the first word line, the controller applies the fourth voltage to the first bit line, the second bit line, and the third bit line.

3. The semiconductor memory device of claim 1, wherein in the write operation, after applying the first voltage, the second voltage, and the third voltage to the first word line, the controller applies a sixth voltage higher than the first voltage, a seventh voltage higher than the second voltage, and an eighth voltage higher than the third voltage to the first word line sequentially.

4. The semiconductor memory device of claim 1, wherein in the write operation, after applying the first voltage, the second voltage, and the third voltage to the first word line, the controller applies a ninth voltage higher than the third voltage, a 10th voltage higher than the second voltage, and an 11th voltage higher than the first voltage to the first word line sequentially.

5. The semiconductor memory device of claim 1, wherein in the write operation, the controller applies the first voltage to the first word line again after applying the first voltage to the first word line, the controller applies the second voltage to the first word line again after applying the second voltage to the first word line, and the controller applies the third voltage to the first word line again after applying the third voltage is applied to the first word line.

6. A semiconductor memory device comprising:
a first memory cell, a second memory cell, and a third memory cell;
a first word line coupled to the first memory cell, the second memory cell, and the third memory cell; and
a controller configured to apply voltages to the first word line,
wherein in a write operation, after applying a first voltage, a second voltage, and a third voltage to the first word line sequentially, the controller applies a fourth voltage higher than the first voltage, a fifth voltage higher than the second voltage, and a sixth voltage higher than the third voltage to the first word line sequentially, and
the first voltage is higher than the second voltage, and the second voltage is higher than the third voltage.

7. The semiconductor memory device of claim 6, further comprising:
a first bit line coupled to the first memory cell;
a second bit line coupled to the second memory cell; and
a third bit line coupled to the third memory cell,
wherein in the write operation, before applying the first voltage, the second voltage, and the third voltage to the first word line, the controller applies a seventh voltage lower than the first voltage, the second voltage, and the third voltage to the first word line, and
when applying the seventh voltage to the first word line, the controller applies an eighth voltage to the first bit line, the second bit line, and the third bit line.

8. The semiconductor memory device of claim 6, wherein in the write operation, the controller applies the first voltage to the first word line again after applying the first voltage to the first word line, the controller applies the second voltage to the first word line again after applying the second voltage to the first word line, and the controller applies the third voltage to the first word line again after applying the third voltage to the first word line.

9. A semiconductor memory device comprising:
a first memory cell and a second memory cell;
a first word line coupled to the first memory cell and the second memory cell;
a first bit line coupled to the first memory cell;
a second bit line coupled to the second memory cell; and
a controller configured to apply voltages to the first word line, first bit line, and second bit line,
wherein the controller applies a first voltage and a second voltage lower than first voltage to the first word line sequentially in a write operation,
the controller applies a third voltage to the first bit line when applying the first voltage to the first word line, and the controller applies the third voltage to the second bit line when applying the second voltage to the first word line, and
in the write operation, the controller applies the first voltage to the first word line again after applying the first voltage to the first word line, and the controller applies the second voltage to the first word line again after applying the second voltage to the first word line.

10. The semiconductor memory device of claim 9, wherein
in the write operation, before applying the first voltage and the second to the first word line, the controller applies a fourth voltage lower than the first voltage and the second voltage to the first word line, and
when applying the fourth voltage to the first word line, the controller applies the third voltage to the first bit line and the second bit line.

11. The semiconductor memory device of claim 9, wherein in the write operation, after applying the first voltage and the second voltage to the first word line, the controller applies a fifth voltage higher than the first voltage and a sixth voltage higher than the second voltage to the first word line sequentially.

12. The semiconductor memory device of claim 9, wherein in the write operation, after applying the first voltage and the second voltage to the first word line, the controller applies a seventh voltage higher than the second voltage and an eighth voltage higher than the first voltage to the first word line sequentially.

13. The semiconductor memory device of claim 9, further comprising:
a third memory cell and a fourth memory cell;
a second word line coupled to the third memory cell and the fourth memory cell;
a third bit line coupled to the third memory cell; and
a fourth bit line coupled to the fourth memory cell,
wherein in the write operation, the controller applies a ninth voltage and a 10th voltage higher than the ninth voltage to the second word line sequentially, and
the controller applies the third voltage to the third bit line when applying the ninth voltage to the second word line, and the controller applies the third voltage to the fourth bit line when applying the 10th voltage to the second word line.

* * * * *